United States Patent
Pharand et al.

(10) Patent No.: US 9,778,579 B2
(45) Date of Patent: Oct. 3, 2017

(54) SYSTEM AND METHOD FOR CONTROLLING A TEMPERATURE OF A REACTION ASSEMBLY

(71) Applicant: NIKON CORPORATION, Tokyo (JP)

(72) Inventors: Michel Pharand, Los Gatos, CA (US); Chetan Mahadeswaraswamy, San Francisco, CA (US); Michael B. Binnard, Belmont, CA (US)

(73) Assignee: Nikon Corporation (JP)

(*) Notice: Subject to any disclaimer, the term of this patent is extended or adjusted under 35 U.S.C. 154(b) by 382 days.

(21) Appl. No.: 14/357,296

(22) PCT Filed: Nov. 6, 2012

(86) PCT No.: PCT/US2012/063646
§ 371 (c)(1),
(2) Date: Aug. 13, 2014

(87) PCT Pub. No.: WO2013/070568
PCT Pub. Date: May 16, 2013

(65) Prior Publication Data
US 2015/0146176 A1    May 28, 2015

Related U.S. Application Data

(60) Provisional application No. 61/558,156, filed on Nov. 10, 2011.

(51) Int. Cl.
*G03B 27/32* (2006.01)
*G03B 27/52* (2006.01)
(Continued)

(52) U.S. Cl.
CPC ...... *G03F 7/70716* (2013.01); *B01J 19/0093* (2013.01); *G03F 7/70758* (2013.01);
(Continued)

(58) Field of Classification Search
CPC .......... B01J 19/0093; B01J 2219/00783; B01J 2219/00873; G03F 7/70716;
(Continued)

(56) References Cited

U.S. PATENT DOCUMENTS

| | | | | |
|---|---|---|---|---|
| 4,916,340 A | * | 4/1990 | Negishi .................. | B23Q 1/621 310/12.05 |
| 5,528,118 A | * | 6/1996 | Lee ...................... | G03F 7/70716 318/38 |

(Continued)

FOREIGN PATENT DOCUMENTS

| | | |
|---|---|---|
| WO | WO2009083891 A3 | 7/2009 |
| WO | WO2013112759 A1 | 8/2013 |
| WO | WO2013112761 A2 | 8/2013 |

OTHER PUBLICATIONS

The International Preliminary Report on Patentability for PCT/US12/63646, May 5, 2015, Nikon Corporation (related application).
(Continued)

*Primary Examiner* — Colin Kreutzer
(74) *Attorney, Agent, or Firm* — Roeder & Broder LLP; Steven G. Roeder

(57) ABSTRACT

A stage assembly (10) that includes (i) a stage (14) that retains a device (26); (ii) a reaction assembly (18) that is spaced apart from the stage (14); (iii) a stage mover (16) that moves the stage (14), the stage mover (16) including a magnet array (38) that is coupled to the stage (14) and a conductor array (36) that is coupled to the reaction assembly (18); (iv) a temperature adjuster (20); and (v) a control system (22) that selectively controls the temperature adjuster (20). The conductor array (36) includes a set of first zone conductor units (250), and a set of second zone conductor units (252). The temperature adjuster (20) independently
(Continued)

adjusts the temperature of the set of first zone conductor units (250), and the set of second zone conductor units (252).

32 Claims, 14 Drawing Sheets

(51) Int. Cl.
    *G03B 27/58*     (2006.01)
    *H02K 41/02*     (2006.01)
    *H02K 41/03*     (2006.01)
    *G03F 7/20*     (2006.01)
    *H01L 21/68*     (2006.01)
    *B01J 19/00*     (2006.01)

(52) U.S. Cl.
    CPC ...... *G03F 7/70858* (2013.01); *G03F 7/70875* (2013.01); *H01L 21/682* (2013.01); *B01J 2219/00783* (2013.01); *B01J 2219/00873* (2013.01)

(58) Field of Classification Search
    CPC ............. G03F 7/70758; G03F 7/70858; G03F 7/70875; H01L 21/682
    USPC ...... 310/12.05, 12.06, 12.29; 355/30, 72, 77
    See application file for complete search history.

(56) References Cited

U.S. PATENT DOCUMENTS

| | | | |
|---|---|---|---|
| 6,226,073 B1 * | 5/2001 | Emoto | .................... G03F 7/707 310/12.06 |
| 6,313,550 B1 | 11/2001 | Binnard et al. | |
| 6,323,567 B1 | 11/2001 | Hazelton et al. | |
| 6,509,951 B2 | 1/2003 | Loopstra et al. | |
| 6,864,602 B2 | 3/2005 | Korenaga | |
| 6,956,308 B2 | 10/2005 | Binnard | |
| 7,548,303 B2 | 6/2009 | Sogard | |
| 7,583,361 B2 | 9/2009 | Hsin et al. | |
| 7,804,575 B2 | 9/2010 | Cadee et al. | |
| 7,948,122 B2 | 5/2011 | Compter et al. | |
| 2004/0128918 A1 | 7/2004 | Yang et al. | |
| 2004/0222707 A1 * | 11/2004 | Sato | ........................ H02K 41/03 310/12.06 |
| 2005/0088634 A1 * | 4/2005 | Kosugi | ............... G03F 7/70716 355/30 |
| 2005/0140959 A1 * | 6/2005 | Tsuji | .................... G03F 7/70858 355/72 |
| 2005/0212361 A1 * | 9/2005 | Emoto | ................ G03F 7/70758 310/12.15 |
| 2006/0209287 A1 * | 9/2006 | Tanaka | ................ G03F 7/70875 355/55 |
| 2008/0073563 A1 | 3/2008 | Novak et al. | |
| 2010/0156198 A1 * | 6/2010 | Cooper | ............... G03F 7/70758 310/12.06 |
| 2011/0053061 A1 | 3/2011 | Shibizaki | |
| 2013/0140372 A1 | 6/2013 | Mahadeswaraswamy et al. | |
| 2013/0164687 A1 | 6/2013 | Binnard et al. | |

OTHER PUBLICATIONS

The International Search Report and Written Opinion of the International Searching Authority, Feb. 1, 2013, Nikon Corporation, PCT/US12/63646 (related application).
U.S. Appl. No. 09/654,663, filed Sep. 5, 2000.
U.S. Appl. No. 61/590,687, filed Jan. 25, 2012.
U.S. Appl. No. 13/526,994, filed Jun. 19, 2012.
U.S. Appl. No. 61/512,916, filed Jul. 29, 2011.
U.S. Appl. No. 13/225,235, filed Sep. 2, 2011.

\* cited by examiner

SYSTEM AND METHOD FOR CONTROLLING A TEMPERATURE OF A REACTION ASSEMBLY

RELATED INVENTION

This application claims priority on U.S. Provisional Application Ser. No. 61/558,156, filed Nov. 10, 2011 and entitled "SYSTEM AND METHOD FOR CONTROLLING A TEMPERATURE OF A REACTION ASSEMBLY. As far as permitted, the contents of U.S. Provisional Application Ser. No. 61/558,156 are incorporated herein by reference.

BACKGROUND

Exposure apparatuses are commonly used to transfer images from a reticle onto a semiconductor wafer during semiconductor processing. A typical exposure apparatus includes an illumination source, a reticle stage assembly that retains a reticle, a lens assembly and a wafer stage assembly that retains a semiconductor wafer. Typically, the wafer stage assembly includes a wafer stage base, a wafer stage that retains the wafer, and a wafer stage mover assembly that precisely positions the wafer stage and the wafer. Somewhat similarly, the reticle stage assembly includes a reticle stage base, a reticle stage that retains the reticle, and a reticle stage mover assembly that precisely positions the reticle stage and the reticle. The size of the images and the features within the images transferred onto the wafer from the reticle are extremely small. Accordingly, the precise relative positioning of the wafer and the reticle is critical to the manufacturing of high density, semiconductor wafers.

Unfortunately, the stage mover assemblies generate heat that can influence the other components of the exposure apparatus. Conventionally, the stage mover assemblies are cooled by forcing a coolant around the movers of the stage mover assembly. However, existing coolant systems do not adequately or efficiently cool the movers of the stage mover assembly. This can reduce the accuracy of positioning of the wafer relative to the reticle, and degrade the accuracy of the exposure apparatus.

SUMMARY

The present invention is directed to a stage assembly that moves a device. In one embodiment, the stage assembly includes (i) a stage that retains the device; (ii) a reaction assembly that is spaced apart from the stage; (iii) a stage mover that moves the stage, the stage mover including a magnet array that is coupled to the stage and a conductor array that is coupled to the reaction assembly, the conductor array including a set of first zone conductor units, and a set of second zone conductor units; (iv) a temperature adjuster that independently adjusts the temperature of the set of first zone conductor units, and the set of second zone conductor units; and (v) a control system that selectively controls the temperature adjuster.

With this design, more circulation fluid can be directed to the conductor units that are used the most and that are generating the most heat. This will allow for the efficient cooling of the stage mover. Further, with this design, the temperature adjuster can efficiently and accurately maintain a substantially uniform temperature of the stage mover and the reaction assembly. This allows for more accurate positioning of the stage.

In one embodiment, the temperature adjuster directs a circulation fluid into the set of first zone conductor units at a first flow rate, and directs the circulation fluid into the set of second zone conductor units at a second flow rate that is different than the first flow rate. In this embodiment, the control system selectively controls the first flow rate to cool the first zone conductor units to a desired first temperature, and selectively adjusts the second flow rate to cool the second zone conductor units to a desired second temperature. Further, in this embodiment, the circulation fluid can be directed to each of the first zone conductor units substantially in parallel, and the circulation fluid can be directed to each of the second zone conductor units substantially in parallel.

Additionally, the conductor array can include a set of third zone conductor units. In this embodiment, the temperature adjuster directs the circulation fluid into the set of third zone conductor units at a third flow rate that is different from the first flow rate and the second flow rate. Further, the control system can selectively control the third flow rate to cool the set of third zone conductor units to a desired third temperature.

In one embodiment, the control system includes a model temperature estimator that estimates the temperature of the first zone conductor units and that estimates the temperature of the second zone conductor units. Further, in this embodiment, the control system adjusts the first flow rate based on the estimated temperature of the first zone conductor units, and adjusts the second flow rate based on the estimated temperature of the second zone conductor units. Moreover, in this embodiment, the stage assembly can include a feedback assembly that provides feedback regarding the temperature of at least a portion of the first zone conductor units and at least a portion of the second zone conductor units. In this embodiment, the feedback can be fed into the model temperature estimator to improve the model temperature estimator.

As provided herein, each of the conductor units can include a surface housing that is adjacent to the magnet array. In this embodiment, the temperature adjuster can direct a surface circulation fluid through the surface housing of each of the conductor units to maintain the temperature of the surface housings at a predetermined surface temperature.

Additionally, each conductor unit can includes a first coil set, a second coil set and a body housing positioned near coil sets. In this embodiment, the circulation fluid is directed through the body housing of each of the conductor units.

In yet another embodiment, the stage assembly can include: (i) a stage that retains the device; (ii) a rigid stage base; (iii) a countermass reaction assembly that is supported by the stage base and that moves relative to the stage base along the first axis; (iv) a planar, stage mover that moves the stage, the stage mover including a magnet array that is coupled to the stage and a conductor array that is coupled to the reaction assembly, the conductor array including a set of first zone conductor units, and a set of second zone conductor units, wherein current directed to the conductor array generates a force that can move the magnet array and the stage along the first axis in a first direction, and the conductor array and the countermass reaction assembly along the first axis in a second direction that is opposite the first direction; wherein each conductor unit includes a first coil set, a second coil set, a body housing positioned near coil sets, and a surface housing; (v) a temperature adjuster that directs (a) a body circulation fluid into the body housing of each of the first zone conductor units at a first flow rate, and into the body housing of each of the second zone conductor units at a second flow rate that is different than the first flow rate; and (b) a surface circulation fluid through the surface housing of each of the conductor units to maintain the temperature of the surface housings at a predetermined surface temperature; and (vi) a control system that selectively controls the temperature adjuster to selectively adjust the first flow rate to cool the first zone conductor units to a desired first temperature, and to selectively adjust the second flow rate to cool the second zone conductor units to a desired second temperature.

The present invention is directed to a method for moving a device that includes the steps of: (i) retaining the device with a stage; (ii) positioning a reaction assembly near the stage; (iii) moving the stage with a stage mover that includes a magnet array that is coupled to the stage and a conductor array that is coupled to the reaction assembly, the conductor array including a set of first zone conductor units, and a set of second zone conductor units; (iv) independently adjusting the temperature of the set of first zone conductor units, and the set of second zone conductor units with a temperature adjuster; and (v) controlling the temperature adjuster with a control system.

The present invention is also directed to an exposure apparatus, a device manufactured with the exposure apparatus, and/or a wafer on which an image has been formed by the exposure apparatus. Further, the present invention is also directed to a method for making an exposure apparatus, a method for making a device and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
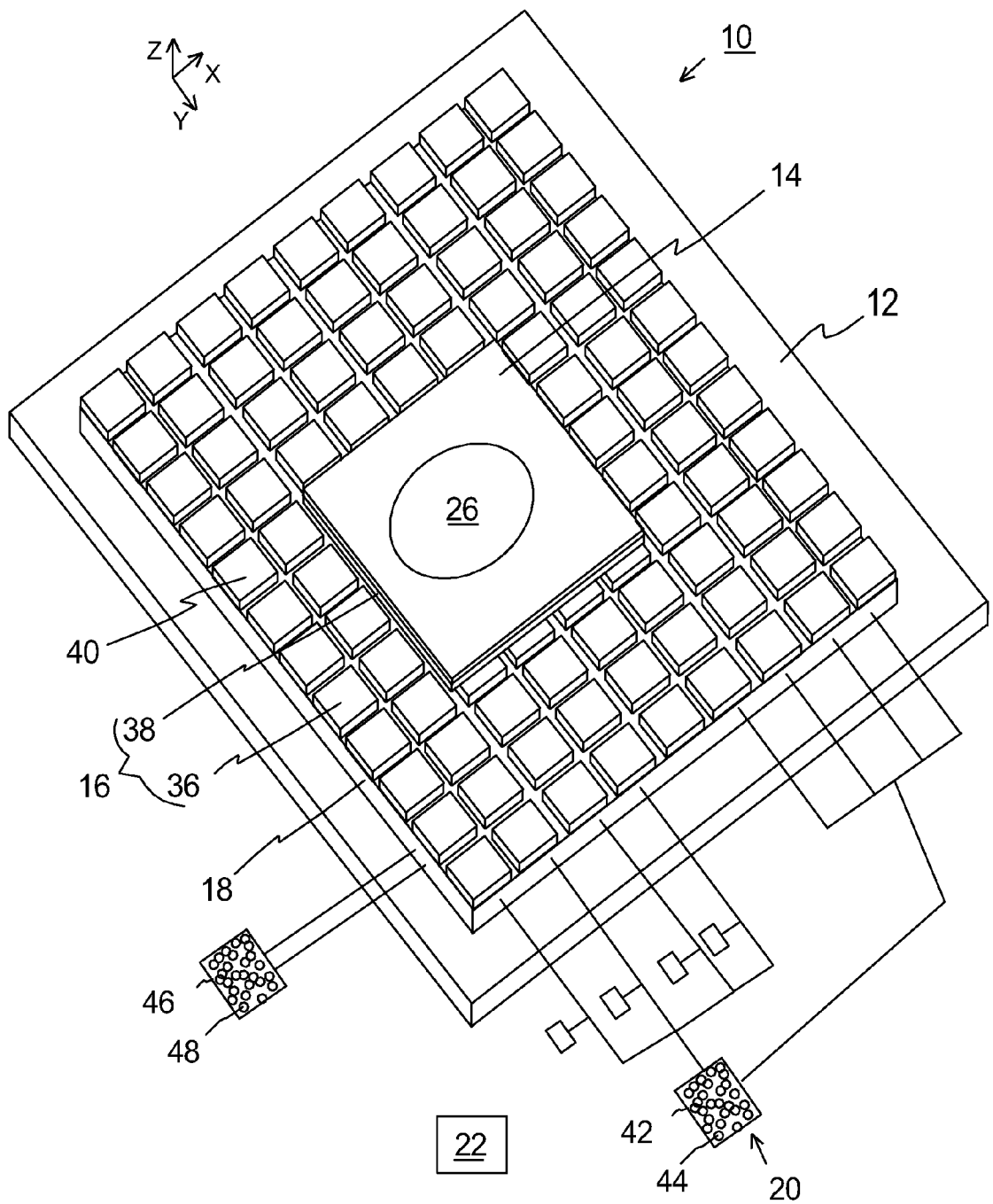
FIG. 1 is a perspective view of a stage assembly having features of the present invention.

Referring initially to FIG. 1, a stage assembly 10 having features of the present invention includes a stage base 12, a stage 14, a stage mover 16, a reaction assembly 18, a temperature adjuster 20, and a control system 22. The design of each of these components can be varied to suit the design requirements of the assembly 10. The stage assembly 10 can be positioned above a mounting base 624 (illustrated in FIG. 6). The stage mover 16 precisely moves the stage 14 relative to the stage base 12 and the reaction assembly 18.

As an overview, in certain embodiments, the temperature adjuster 20 can independently control the flow rate of a circulation fluid 44 to different areas of the stage mover 16. With this design, more circulation fluid 44 can be directed to areas of the stage mover 16 that are used the most and that are generating the most heat. This will allow for the efficient cooling of the stage mover 16. Further, with this design, the temperature adjuster 20 can efficiently and accurately maintain a substantially uniform temperature of the stage mover 16 and the reaction assembly 18. This allows for more accurate positioning of the stage 14.

The stage assembly 10 is particularly useful for precisely positioning a device 26 during a manufacturing and/or an inspection process. The type of device 26 positioned and moved by the stage assembly 10 can be varied. For example, the device 26 can be a semiconductor wafer, and the stage assembly 10 can be used as part of an exposure apparatus 630 (illustrated in FIG. 6) for precisely positioning the semiconductor wafer during manufacturing of the semiconductor wafer. Alternately, for example, the stage assembly 10 can be used to move other types of devices during manufacturing and/or inspection, to move a device under an electron microscope (not shown), or to move a device during a precision measurement operation (not shown).

Some of the Figures provided herein include an orientation system that designates an X axis, a Y axis, and a Z axis. It should be understood that the orientation system is merely for reference and can be varied. For example, the X axis can be switched with the Y axis and/or the stage assembly 10 can be rotated. Moreover, these axes can alternatively be referred to as a first, second, or third axis.

The stage base 12 supports a portion of the stage assembly 10 above the mounting base 624. In the embodiment illustrated herein, the stage base 12 is rigid and generally rectangular shaped.

The stage 14 retains the device 26. Further, the stage 14 is precisely moved by the stage mover 16 to precisely position the device 26. In the embodiments illustrated herein, the stage 14 is generally rectangular shaped and includes a device holder (not shown) for retaining the device 26. The device holder can be a vacuum chuck, an electrostatic chuck, or some other type of clamp.

The stage 14 can be maintained spaced apart (e.g. above) the reaction assembly 18 with the stage mover 16 if the stage mover 16 is a six degree of freedom mover that moves stage 14 relative to the reaction assembly 18 with six degrees of freedom. In this embodiment, the stage mover 16 functions as a magnetic type bearing that levitates the stage 14. Alternatively, for example, the stage 14 can be supported relative to the reaction assembly 18 with a stage bearing (not shown), e.g. a vacuum preload type fluid bearing. For example, the bottom of the stage 14 can include a plurality of spaced apart fluid outlets (not shown), and a plurality of spaced apart fluid inlets (not shown). In this example, pressurized fluid (not shown) can be released from the fluid outlets towards the reaction assembly 18 and a vacuum can be pulled in the fluid inlets to create a vacuum preload type, fluid bearing between the stage 14 and the reaction assembly 18. In this embodiment, the stage bearing allows for motion of the stage 14 relative to the reaction assembly 18 along the X axis, along the Y axis and about the Z axis.

The stage mover 16 controls and adjusts the position of the stage 14 and the device 26 relative to the reaction assembly 18 and the stage base 12. For example, the stage mover 16 can be a planar motor that moves and positions of the stage 14 along the X axis, along the Y axis and about the Z axis ("three degrees of freedom" or "the planar degrees of freedom"). Further, in certain embodiments, the stage mover 16 can also be controlled to move the stage 14 along Z axis and about the X and Y axes. With this design, the stage mover 16 is a six degree of freedom mover. Alternatively, in certain embodiments, the stage mover 16 can be another type of actuator designed to move the stage 14 with less than six degrees of freedom.

In the embodiments illustrated herein, the stage mover 16 includes a conductor array 36, and an adjacent magnet array 38 that interacts with the conductor array 36. In FIG. 1, the conductor array 36 is coupled to the reaction assembly 18, and the magnet array 38 secured to the stage 14. As provided herein, the array secured to the stage 14 can be referred to as the moving component of the stage mover 16, and the array secured to the reaction assembly 18 can be referred to as the reaction component of the stage mover 16.

In one embodiment, the conductor array 36 can include a plurality of conductor units 40, and each conductor unit 40 can include one or more conductors (not shown in FIG. 1). The design and number of conductor units 40 in the conductor array 36 can vary according to the performance and movement requirements of the stage mover 16.

Further, the magnet array 38 can include one or more magnets. The design of the magnet array and the number of magnets in each magnet array can be varied to suit the design requirements of the stage mover 16. Each magnet can be made of a permanent magnetic material such as NdFeB.

Electrical current (not shown) is supplied to the conductors by the control system 22. The electrical current in the conductors interacts with the magnetic field(s) of the one or more magnets in the magnet array 38. This causes a force (Lorentz type force) between the conductors and the magnets that can be used to move the stage 14 relative to the stage base 12.

Unfortunately, the electrical current supplied to the conductors also generates heat, due to resistance in the conductors. The heat from the conductors is subsequently transferred to the reaction assembly 18. This can cause expansion and distortion of the reaction assembly 18. Further, the heat from the conductors can be transferred to the surrounding environment, including the air surrounding the conductors. This can adversely influence a measurement system (not shown in FIG. 1) that measures the position of the stage 14 and the device 26. For example, certain measurement systems utilize one or more interferometers. The heat from the conductor array changes the index of refraction of the surrounding air. This reduces the accuracy of the measurement system and degrades machine positioning accuracy. Moreover, the resistance of the conductors increases as temperature increases. This exacerbates the heating problem and reduces the performance and life of the stage mover 16.

In certain embodiments, to reduce the influence of the heat from the conductors, the present invention actively cools the reaction assembly 18 and the conductor units 40 with the temperature adjuster 20.

The reaction assembly 18 counteracts, reduces and/or minimizes the influence of the reaction forces from the stage mover 16 on the position of the stage base 12 and the mounting base 624. This minimizes the distortion of the stage base 12 and improves the positioning performance of the stage assembly 10. Further, for an exposure apparatus 630, this allows for more accurate positioning of the semiconductor wafer.

As provided above, the conductor array 36 of the stage mover 16 is coupled to the reaction assembly 18. With this design, the reaction forces generated by the stage mover 16 are transferred to the reaction assembly 18. As a result thereof, when the stage mover 16 applies a force to move the stage 14, an equal and opposite reaction force is applied to the reaction assembly 18.

In FIG. 1, the reaction assembly 18 is a rectangular shaped countermass that is maintained above the stage base 12 with a reaction bearing (not shown), e.g. a vacuum preload type fluid bearing. For example, the bottom of reaction assembly 18 can include a plurality of spaced apart fluid outlets (not shown), and a plurality of spaced apart fluid inlets (not shown). Pressurized fluid (not shown) is released from the fluid outlets towards the stage base 12 and a vacuum is pulled in the fluid inlets to create a vacuum preload type, fluid bearing between the stage base 12 and the reaction assembly 18. In this embodiment, the reaction bearing allows for motion of the reaction assembly 18 relative to the stage base 12 along the X axis, along the Y axis and about the Z axis. Alternately, for example, the reaction bearing can be a magnetic type bearing, or a roller bearing type assembly.

With this design, through the principle of conservation of momentum, (i) movement of the stage 14 with the stage mover 16 along the X axis in a first X direction along the X axis, generates an equal but opposite X reaction force that moves the countermass reaction assembly 18 in a second X direction that is opposite the first X direction along the X axis; (ii) movement of the stage 14 with the stage mover 16 along the Y axis in a first Y direction, generates an equal but opposite Y reaction force that moves the countermass reaction assembly 18 in a second Y direction that is opposite the first Y direction along the Y axis; and (iii) movement of the stage 14 with the stage mover 16 about the Z axis in a first theta Z direction, generates an equal but opposite theta Z reaction force (torque) that moves the countermass reaction assembly 18 in a second theta Z direction that is opposite the first theta Z direction about the Z axis.

The design of the countermass reaction assembly 18 can be varied to suit the design requirements of the reaction assembly 18. In certain embodiments, the ratio of the mass of the countermass reaction assembly 18 to the mass of the stage 14 is relatively high. This will minimize the movement of the countermass reaction assembly 18 and minimize the required travel of the countermass reaction assembly 18. A suitable ratio of the mass of the countermass reaction assembly 18 to the mass of the stage 14 is between approximately 2:1 and 10:1. A larger mass ratio is better, but is limited by the physical size of the reaction assembly 18.

In one embodiment, the countermass reaction assembly 18 is made from a non-electrically conductive, non-magnetic material, such as low electrical conductivity stainless steel or titanium, or non-electrically conductive plastic or ceramic.

Additionally, a trim mover (not shown) can be used to adjust the position of the reaction assembly 18 relative to the stage base 12. For example, the trim mover can include one or more rotary motors, voice coil motors, linear motors, electromagnetic actuators, or other type of actuators.

The temperature adjuster 20 reduces the influence of the heat from the conductors of the conductor array 36 from adversely influencing the other components of the stage assembly 10 and the assemblies nearby the stage assembly 10. In one embodiment, the temperature adjuster 20 efficiently reduces the amount of heat transferred from the conductors to the surrounding environment.

The design of the temperature adjuster 20 can vary. In one embodiment, the temperature adjuster 20 includes (i) a body circulation system 42 that directs a body circulation fluid 44 (illustrated as small circles) through the reaction assembly 18 and through a portion of each of the conductor units 40; and (ii) a surface circulation system 46 that directs a surface circulation fluid 48 (illustrated as small circles) through another portion of the reaction assembly 18 and another portion of each of the conductor units 40. With this design, in one embodiment, the circulation systems 42, 46 can be used to inhibit the transfer of heat from the conductors of the conductor array 36 to the surrounding environment.

The type of circulation fluid 44, 48 can be varied. For example, the circulation fluid 44, 48 can be water. In certain embodiments, the circulation fluid 44, 48 can be referred to as a coolant.

As provided herein, during use of the stage assembly 10 (e.g. during an exposure with the exposure apparatus 630), the device 26 is moved by the stage mover 16. Typically, during use of the stage assembly 10, more current is directed to the conductors in certain conductor units 40 than the conductors in other conductor units 40. For example, certain conductor units 40 are primarily used to move the wafer 26 during the scanning portion of an exposure. These conductor units 40 will generate more heat and will require more cooling. As provided herein, the body circulation system 42 and/or the surface circulation system 46 are uniquely designed to provide more cooling to certain conductor units 40 and/or groups of conductor units 40. The design of the circulation systems 42, 46 are discussed in more detail below.

Figure 6:
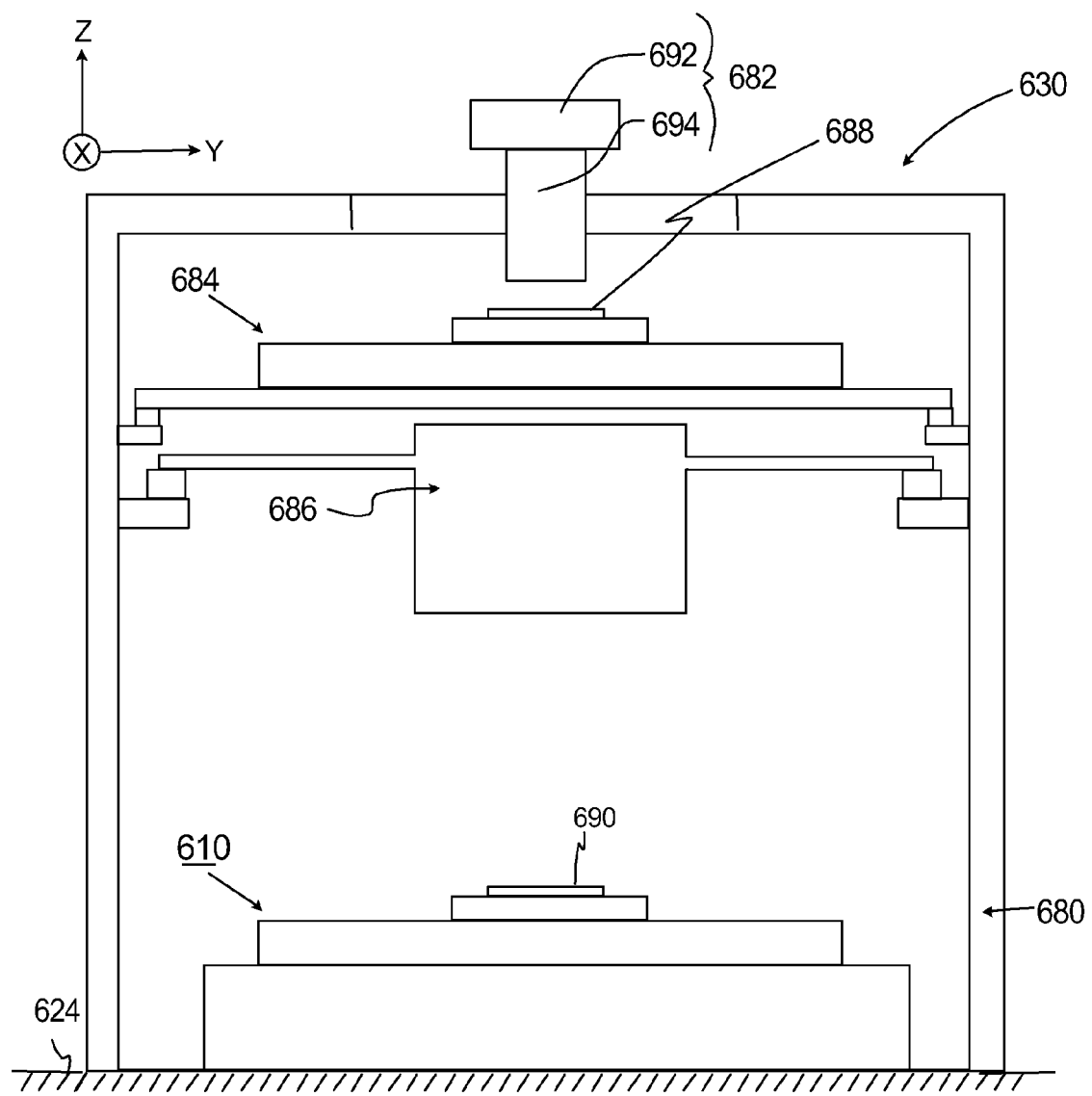
FIG. 6 is a schematic illustration of an exposure apparatus having features of the present invention.

The measurement system monitors movement of the stage 14 relative to the stage base 12, or to some other reference such as an optical assembly 686 (illustrated in FIG. 6). With this information, the stage mover 16 can be controlled to precisely position of the stage 14. For example, the measurement system can utilize laser interferometers, encoders, and/or other measuring devices to monitor the position of the stage 14.

The control system 22 is electrically connected to, directs and controls electrical current to the conductors of the stage mover 16 to precisely position the device 26. Further, the control system 22 is electrically connected to and controls the circulation systems 42, 46 of the temperature adjuster to accurately control the temperature of the reaction assembly 18 and the conductor units 40. The control system 22 can include one or more processors.

Figure 2:
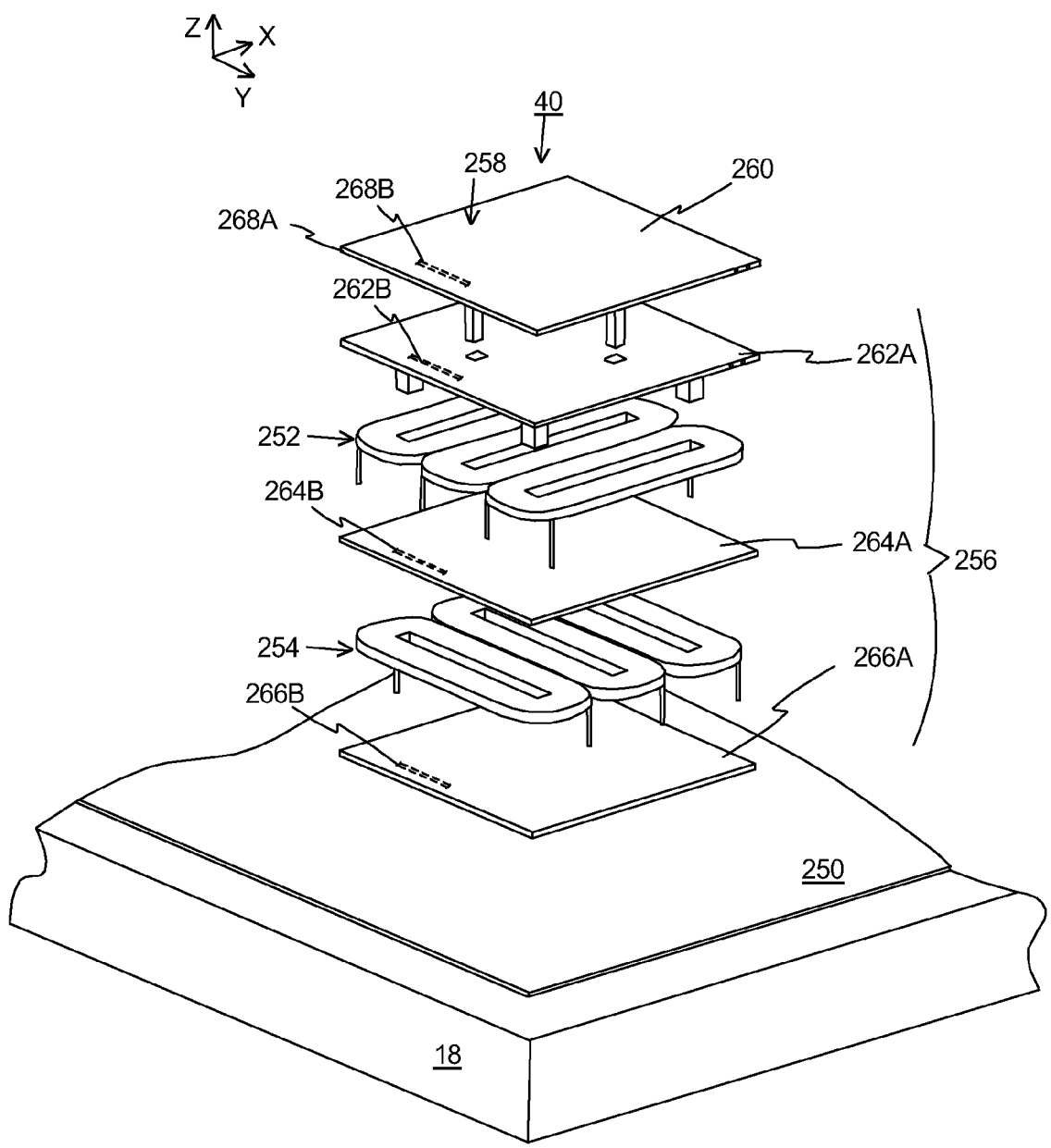
FIG. 2 is an exploded perspective view of a portion of the conductor array and the reaction assembly.

FIG. 2 is an exploded perspective view of one conductor unit 40, a portion of the reaction assembly 18, and a portion of a printed circuit board 250 positioned between the reaction assembly 18 and the conductor unit 40 that electrically connects to the conductor unit 40. The other conductor units in the conductor array 36 (illustrated in FIG. 1) can be similar to the conductor unit 40 illustrated in FIG. 2. Alternatively, the conductor units 40 can have a different design than that illustrated in FIG. 2.

In this non-exclusive embodiment, the conductor unit 40 includes a first ("upper") coil set 252; a second ("lower") coil set 254 that is positioned below and is spaced apart from the first coil set 252; a body circulation assembly 256; and a surface circulation assembly 258. Alternatively, the conductor unit 40 can be designed without some of these components. For example, the conductor unit 40 can be designed to include a single coil set.

The design of each coil set 252, 254 and the number of conductors in each coil set 252, 254 can be varied to suit the design requirements of the stage mover 16 (illustrated in FIG. 1). In FIG. 2, for a three phase planar motor, each coil set 252, 254 includes three adjacent racetrack shaped coils that are aligned side by side. In one embodiment, (i) the first coil set 252 can also be referred to as a Y coil set because current directed to the first coil set 252 is used to generate a force along the Y axis; and (ii) the second coil set 254 can also be referred to as a X coil set because current directed to the second coil set 254 is used to generate a force along the X axis. Alternatively, the orientation of the coil sets 252, 254 can switched or the size of the coil sets 252, 254 can be different than that illustrated in FIG. 2.

Each coil can be made of metal such as copper or any substance or material responsive to electrical current and capable of creating a magnetic field such as superconductors. Alternatively, each coil set 252, 254 can include more than three or fewer than three coils.

As provided herein, in one embodiment, (i) the body circulation system 42 (illustrated in FIG. 1) directs the body circulation fluid 44 (illustrated in FIG. 1) through the body circulation assembly 256 of each conductor unit 40 to remove the heat generated by the operation of the respective conductor unit 40; and (ii) the surface circulation system 46 (illustrated in FIG. 1) directs the surface circulation fluid 48 (illustrated in FIG. 1) through the surface circulation assembly 258 of each conductor unit 40 to maintain an upper, outer surface 260 of each conductor unit 40 at the desired temperature. The design of each circulation assembly 256, 258 can be varied to suit the design requirements of each conductor unit 40.

In FIG. 2, the body circulation assembly 256 includes (i) an upper body housing 262A that defines one or more upper passageways 262B, e.g. micro-channels, (a portion illustrated in phantom) that weave back and forth within the upper body housing 262A; (ii) a middle body housing 264A that defines one or more middle passageways 264B, e.g. micro-channels, (a portion illustrated in phantom) that weave back and forth within the middle body housing 264A; and (iii) a lower body housing 266A that defines one or more lower passageways 266B, e.g. micro-channels, (a portion illustrated in phantom) that weave back and forth within the lower body housing 266A. Further, the surface circulation assembly 258 includes a surface housing 268A that defines one or more surface passageways 268B, e.g. micro-channels, (a portion illustrated in phantom) that weave back and forth within the surface housing 268A. In one embodiment, each housing 262A, 264A, 266A, 268A is generally flat, rectangular plate shaped and is made from a non-electrically conductive, non-magnetic material, such as titanium, or non-electrically conductive plastic or ceramic. Further, in this embodiment, the housings 262A, 264A, 266A, 268A are substantially parallel to each other.

Moving from the bottom to the top in FIG. 2, the components of the conductor unit 40 are assembled as follows, (i) the lower body housing 266A is positioned adjacent to and above the printed circuit board 250; (ii) the lower coil set 254 is positioned above the lower body housing 266A, (iii) the middle body housing 264A is positioned adjacent to and above the lower coil set 254; (iv) the upper coil set 252 is positioned adjacent to and above the middle body housing 264A; (v) the upper body housing 262A is positioned adjacent to and above the upper coil set 252; and (vi) the surface housing 268A is positioned adjacent to and above the upper body housing 262A.

With this design, the body circulation fluid 44 can be directed through (i) the lower body housing 266A, (ii) the middle body housing 264A, and (iii) the upper body housing 262A to remove the bulk of the heat generated by the coil sets 252, 254. Further, the surface circulation fluid 48 can be directed through the surface housing 268A to maintain the surface temperature of each conductor unit 40 at the desired temperature to inhibit the transfer of heat from each conductor unit 40.

Figure 3A:
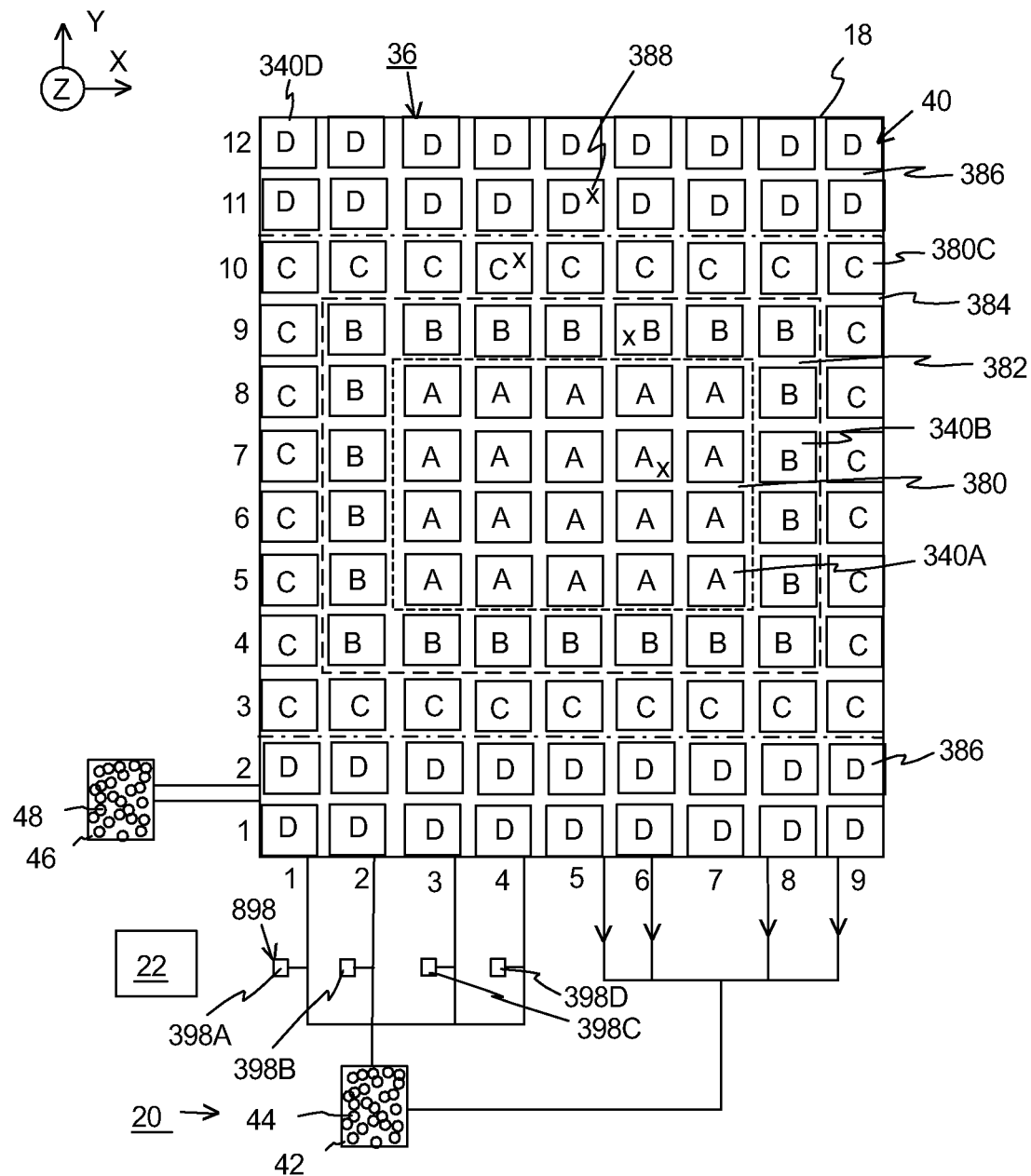
FIG. 3A is a top plan view of a conductor array, a reaction assembly, a schematic of a temperature adjuster, and a control system having features of the present invention.

FIG. 3A is a simplified top view of the conductor array 36 including the plurality of conductor units 40, and the reaction assembly 18, and a schematic of the temperature adjuster 20, and the control system 22 of FIG. 1. As provided herein, the number and design of conductor units 40 can be varied according to the movement requirements of the stage assembly 10 (illustrated in FIG. 1). For example, in FIG. 3A, the conductor array 36 includes one hundred and eight separate, spaced apart, generally rectangular shaped, conductor units 40 that are secured to the countermass reaction assembly 18 in a two dimensional, planar array. It should be noted that the twelve rows and nine columns of the conductor array 36 are labeled in some of the Figures for reference. Alternatively, the conductor array 36 can include more than or fewer than one hundred and eight separate conductor units 40. Further, one or more of the conductor units 40 can have a shape other than rectangular.

As provided herein, depending upon the desired usage of the stage assembly 10, certain conductor units 40 will be used more than other conductor units 40 to move the stage 14. Further, the conductor units 40 that are used more will generate more heat and will require more cooling via the temperature controller 20. In one embodiment, the conductor array 36 and the countermass reaction assembly 18 are divided into a plurality of different zones depending upon the projected heat generated each conductor unit 40 and their respective cooling requirements. In one, non-exclusive example, the conductor array 36 and the countermass reaction assembly 18 can be divided into (i) a centrally located, rectangular shaped first zone 380 (the outer boundary illustrated with a short dashed line); (ii) a rectangular tube shaped second zone 382 (the outer boundary is illustrated with a long dashed line and the inner boundary is illustrated with the short dashed line); (iii) a rectangular tube shaped third zone 384 (the outer boundary is illustrates with a dash-dot line and the inner boundary is illustrated with the long dashed line); and (iv) a pair of rectangular shaped fourth zones 386. Further, in this example, (i) the conductor units 40 that are part of the first zone 380 are labeled with an "A" and can be referred to as first zone conductor units 340A; (ii) the conductor units 40 that are part of the second zone 382 are labeled with a "B" and can be referred to as second zone conductor units 340B; (iii) the conductor units 40 that are part of the third zone 384 are labeled with a "C" and can be referred to as third zone conductor units 340C; and (iv) the conductor units 40 that are part of the fourth zones 386 are labeled with a "D" and can be referred to as fourth zone conductor units 340D.

In this example, generally speaking, (i) the first zone conductor units 340A are used the most and require the most cooling; (ii) the second zone conductor units 340B are used the second most and require the second most cooling; (iii) the third zone conductor units 340C are used the third most and require the third most cooling; and (iv) the fourth zone conductor units 340D are used the least and require the least cooling. In this embodiment, the conductor units 40 are grouped based on usage. Stated in another fashion, in the embodiment illustrated in FIG. 3A, the conductor array 36 has been divided (i) a set of first zone conductor units 340A that includes twenty conductor units that require approximately the same amount of cooling; (ii) a set of second zone conductor units 340B that includes twenty-two conductor units that require approximately the same amount of cooling; (iii) a set of third zone conductor units 340C that includes thirty conductor units that require approximately the same amount of cooling; and (iv) two sets of fourth zone conductor units 340D that each includes eighteen conductor units that require approximately the same amount of cooling.

Alternatively, depending upon the usage of the stage assembly 10, the conductor units 40 can be grouped into different zones and/or the conductor array 36 and the countermass reaction assembly 18 can be divided into more than four or fewer than four zones, and/or the shapes of the zones can be different.

Additionally, the conductor array 36 can include one or more feedback elements 388 (represented with an "x") that provided feedback to the control system 22 for controlling the temperature adjuster 20. In certain embodiments, each of zones 380, 382, 384, 386 includes one or more feedback elements 388. A non-exclusive example of a suitable feedback element 388 is a temperature sensor.

Figure 3B:
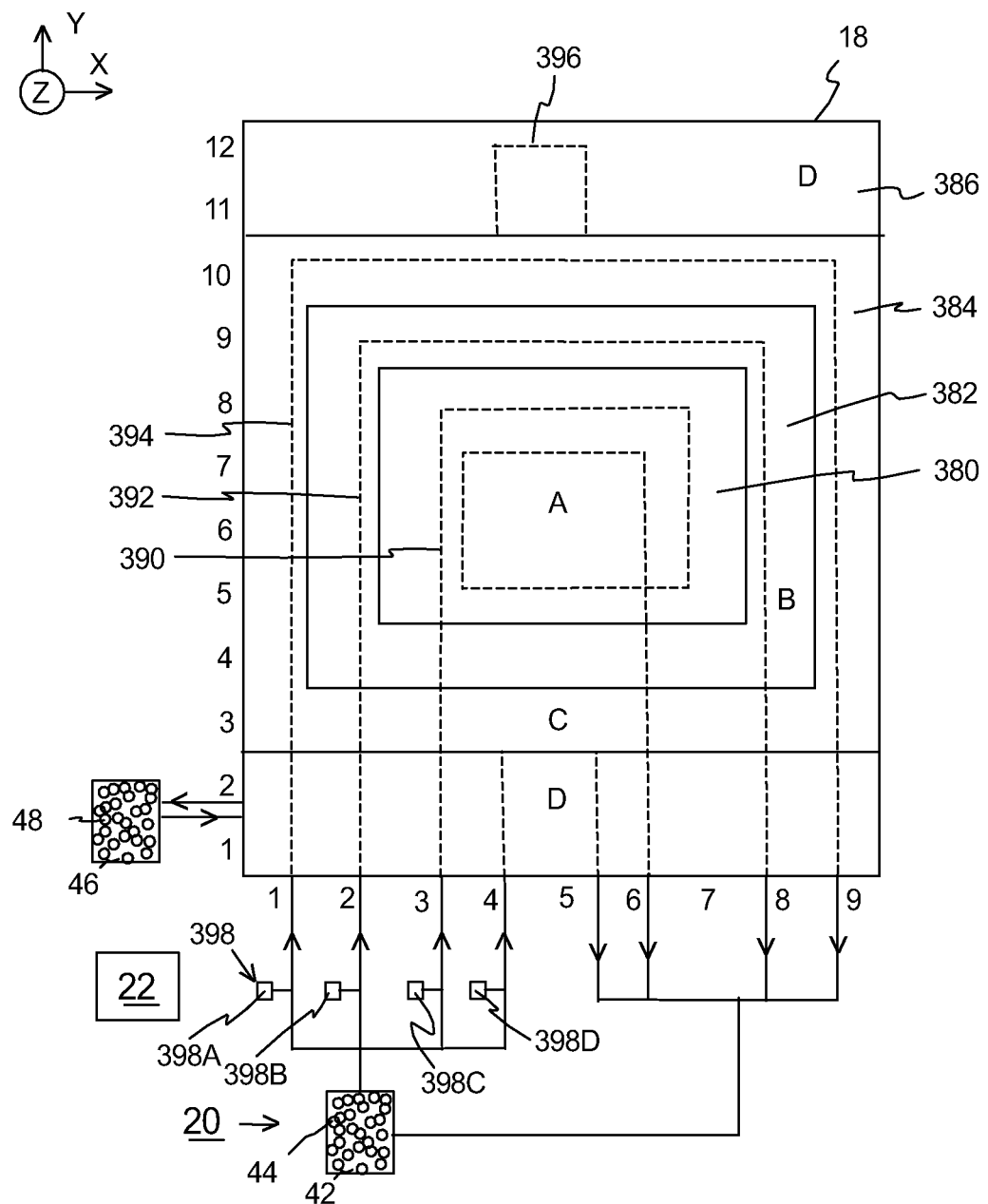
FIG. 3B is a top plan view of the reaction assembly, the schematic illustration of the temperature adjuster, and the control system of FIG. 3A.

FIG. 3B is a simplified top view of the reaction assembly 18, and a schematic of the temperature adjuster 20, and the control system 22. In this embodiment, the reaction assembly 18 includes (i) a first passageway 390 that is routed through the first zone 380; (ii) a second passageway 392 that is routed through the second zone 382; (iii) a third passageway 394 that is routed through the third zone 384; and (iv) a fourth passageway 396 that is routed through the fourth zones 386. It should be noted that the design of each passageway 390, 392, 394, 396 can be varied to suit the cooling requirements of the reaction assembly 18 and the sets of conductor units 40. It should also be noted that the simplified illustration of each passageway 390, 392, 394, 396 is merely for reference.

As one non-exclusive example, (i) the first passageway 390 can include a manifold (not shown) that is in fluid communication with each of the first zone conductor units 340A (illustrated in FIG. 3A); (ii) the second passageway 392 can include a manifold (not shown) that is in fluid communication with each of the second zone conductor units 340B (illustrated in FIG. 3A); (iii) the third passageway 394 can include a manifold (not shown) that is in fluid communication with each of the third zone conductor units 340C (illustrated in FIG. 3A); and (iv) the fourth passageway 396 can include a manifold (not shown) that is in fluid communication with each of the fourth zone conductor units 340D (illustrated in FIG. 3A).

Referring to FIGS. 3A and 3B, the temperature adjuster 20 independently adjusts and controls the temperature of each of the zones, e.g. the first zone 380, the second zone 382, the third zone 384, and the fourth zone 386. The temperature of each zone can be controlled to be the same or different. As provided herein, the body circulation system 42 can independently direct and control the flow rate of the body circulation fluid 44 through (i) the first passageway 390 and the first zone conductor units 340A; (ii) the second passageway 392 and the second zone conductor units 340B; (iii) the third passageway 394 and the third zone conductor units 340C; and (iv) the fourth passageway 396 and the fourth zone conductor units 340D.

Stated in another fashion, the temperature adjuster 20 can direct the body circulation fluid 44 (i) at a first flow rate through the first passageway 390 and each of the first zone conductor units 340A; (ii) at a second flow rate through the second passageway 392 and each of the second zone conductor units 340B; (iii) at a third flow rate through the third passageway 394 and each of the third zone conductor units 340C; and (iv) at a fourth flow rate through the fourth passageway 396 and each of the fourth zone conductor units 340D. Further, each of the flow rate can be controlled to be different. In this example, the first flow rate is the largest, the second flow rate is the next largest, the third flow rate is the subsequently largest, and the fourth flow rate is the smallest. As a non-exclusive examples, the difference between flow rates can vary approximately 10, 20, 40, 50, or 90 percent. With this design, the temperature adjuster 20 can efficiently direct the body circulation fluid 44 to the conductor units 40 that require the most cooling.

In certain embodiments, the body circulation system 42 further includes a chiller (not shown) for controlling the temperature of the body circulation fluid 44 that is delivered to the conductor array 36. As is well known to those skilled in the art, such a chiller typically includes both heaters and a refrigeration system to allow precise control of the temperature of body circulation fluid 44. According to the specific requirements of each embodiment, the chiller can be configured in a way to allow the temperature adjuster 20 to adjust the temperature of body circulation fluid 44 supplied to each of the passageways 390, 392, 394, and 396.

In one embodiment, the body circulation system 42 can include a body fluid source (not shown) that provides pressurized body circulation fluid 44 to the passageways 390, 392, 394, 396 at the desired temperature, and a valve assembly 398 that includes (i) a first valve 398A that is independently adjusted to control the first flow rate, (ii) a second valve 398B that is independently adjusted to control the second flow rate, (iii) a third valve 398C that is independently adjusted to control the third flow rate, and (iv) a fourth valve 398D that is independently adjusted to control the fourth flow rate. With this design, the flow rate of the body circulation fluid 44 can be selectively controlled to be different for each of the circulation zones 380, 382, 384, 386. In one embodiment, the flow rates in each circulation zone 380, 382, 384, 386 and temperature of the first circulation fluid 44 is controlled to remove the heat from the conductor units 40.

In some embodiments, the body circulation system 42 can include two body fluid sources (not shown) that provides pressurized body circulation fluid 44 at two different temperatures (e.g., hot and cold) to the valve assembly 398. The temperature adjuster 20 can direct valves (not shown) within valve assembly 398 to direct varying amounts of body circulation fluid 44 from each supplied temperature to control the temperature of the body circulation fluid 44 supplied to each of the passageways 390, 392, 394, 396.

For example, each valve 398A, 398B, 398C, 398D can be an electronic valve controlled by the control system 22. With this design, the control system 22 can independently and selectively adjust the valves 398A, 398B, 398C, 398D to selectively adjust and control the respective flow rate based on the amount of anticipated heat generated in the respective zone 380, 382, 384, 386. In this embodiment, the valve assembly 398 is illustrated outside of the reaction assembly 18. Alternatively, the valve assembly 398 can be positioned within the reaction assembly 18.

As a non-exclusive example, the body fluid source can include (i) a reservoir that retains the first circulation fluid 44, (ii) a fluid pump that controls the overall flow rate and pressure, and (iii) a chiller/heat exchanger that adjusts the temperature of the first circulation fluid 44. Alternatively, the body fluid source can include multiple fluid pumps and multiple reservoirs. Moreover, the first circulation fluid 44 that is directed through the reaction assembly 18 can be returned to the reservoir for a closed loop circulation system.

Additionally, the temperature adjuster 20 can include the surface circulation system 46 that directs the surface circulation fluid 48 into the surface housing 268A (illustrated in FIG. 2) to maintain the outer surface 260 of each conductor units 40 at the predetermined temperature, e.g. the temperature of the room that houses the stage assembly 10. With this design, the surface circulation system 46 can control the flow rate to maintain the desired temperature of the outer surface 260 of the conductor units 40. For example, the desired temperature can be the temperature of the room that houses the stage assembly 10. By controlling the temperature of the outer surface 260, the amount of heat transferred from the conductor units 40 to the surrounding environment can be controlled and minimized.

In one embodiment, the surface circulation system 46 can include a fluid source that provides pressurized surface circulation fluid 48 to the surface housing 268A at the desired temperature and flow rate. For example, the fluid source can include (i) a reservoir that retains the second circulation fluid 48, (ii) a fluid pump that controls the overall flow rate and pressure, and (iii) a chiller/heat exchanger that adjusts the temperature of the second circulation fluid 48. Moreover, the second circulation fluid 48 that is directed through the reaction assembly 18 and the top covers 266 can be returned to the reservoir for a closed loop circulation system.

The control system 22 selectively controls the temperature adjuster 20. For example, the control system 22 can selectively control the valves 390, 392, 394, 396 to selectively and independently control (i) the first flow rate to cool the first zone 380 to a desired first temperature, (ii) the second flow rate to cool the second zone 382 to a desired second temperature, (iii) the third flow rate to cool the third zone 384 to a desired third temperature, and (iv) the fourth flow rate to cool the fourth zone 386 to a desired fourth temperature. Stated in another fashion, in one embodiment, the temperature controller 20 is controlled by the control system 22 to individually and independently adjust the temperature of the different zones 380, 382, 384, 386.

As provided herein, the problem of a non-uniform surface temperature of the conductor array 36 and the countermass reaction assembly 18 is solved by dividing the conductor array 36 and the countermass reaction assembly 18 into a number of separate zones 380, 382, 384, 386, and directing the body circulation fluid 44 into the separate zones 380, 382, 384, 386 at selectively different rates. This provides an efficient way to maintain a uniform surface temperature of the conductor array 36 and control the surface temperature of the conductor array 36. Further, only a limited number of temperature sensors 388 are necessary to provide feedback to the control system 22.

Figure 3C:
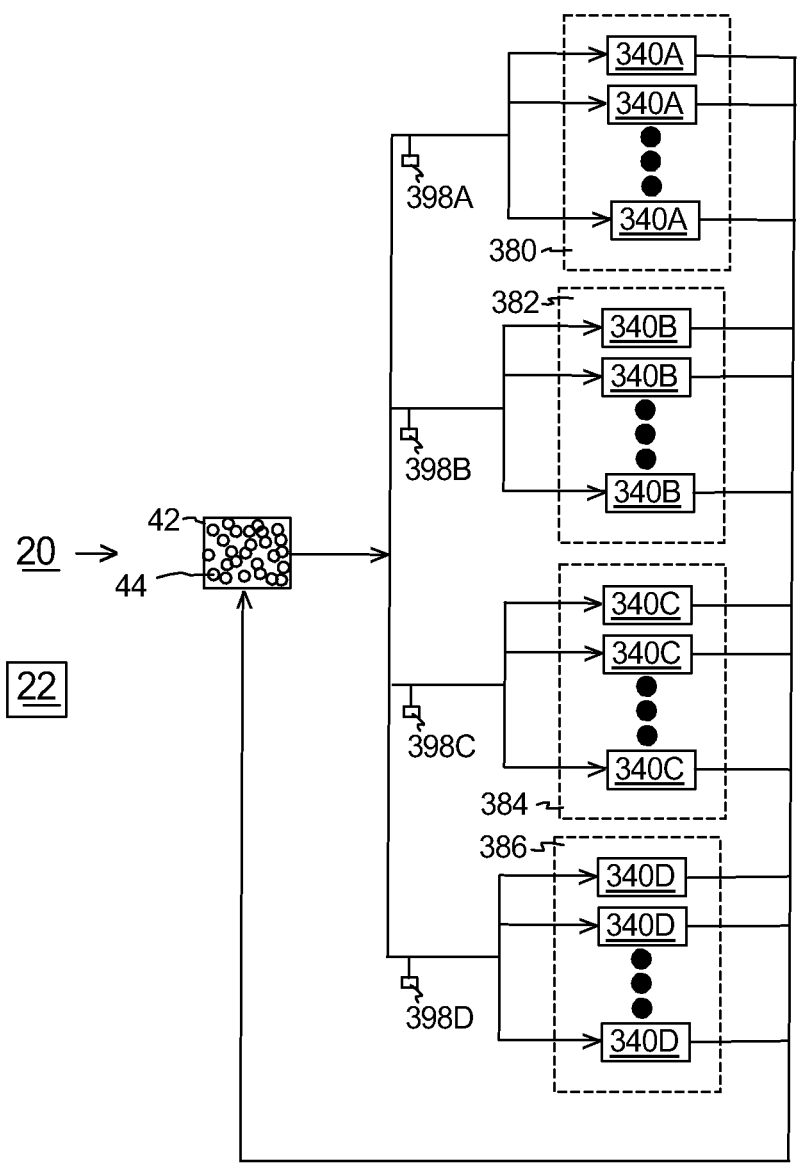
FIG. 3C is a simplified flow chart of a portion of a system having features of the present invention.

FIG. 3C is a simplified schematic of (i) the body circulation system 42, (ii) the valves 398A, 398B, 398C, 398D, (iii) the set of first zone conductor units 340A and the first zone 380; (iv) the set of second zone conductor units 340B and the second zone 382, (v) the set of third zone conductor units 340C and the third zone 384, (vi) the set of fourth zone conductor units 340D and the fourth zone 386, and (vii) the control system 22. In this embodiment, the control system 22 dynamically controls the valves 398A, 398B, 398C, 398D to control the respective flow rates of the body circulation fluid 44 to the zones 380, 382, 384, 386.

It should be noted that in the embodiment illustrated in FIG. 3C, (i) the body circulation fluid 44 flows in parallel through the first zone conductor units 340A; (ii) the body circulation fluid 44 flows in parallel through the second zone conductor units 340B; (iii) the body circulation fluid 44 flows in parallel through the third zone conductor units 340C; and (iv) the body circulation fluid 44 flows in parallel through the fourth zone conductor units 340D.

Figure 3D:
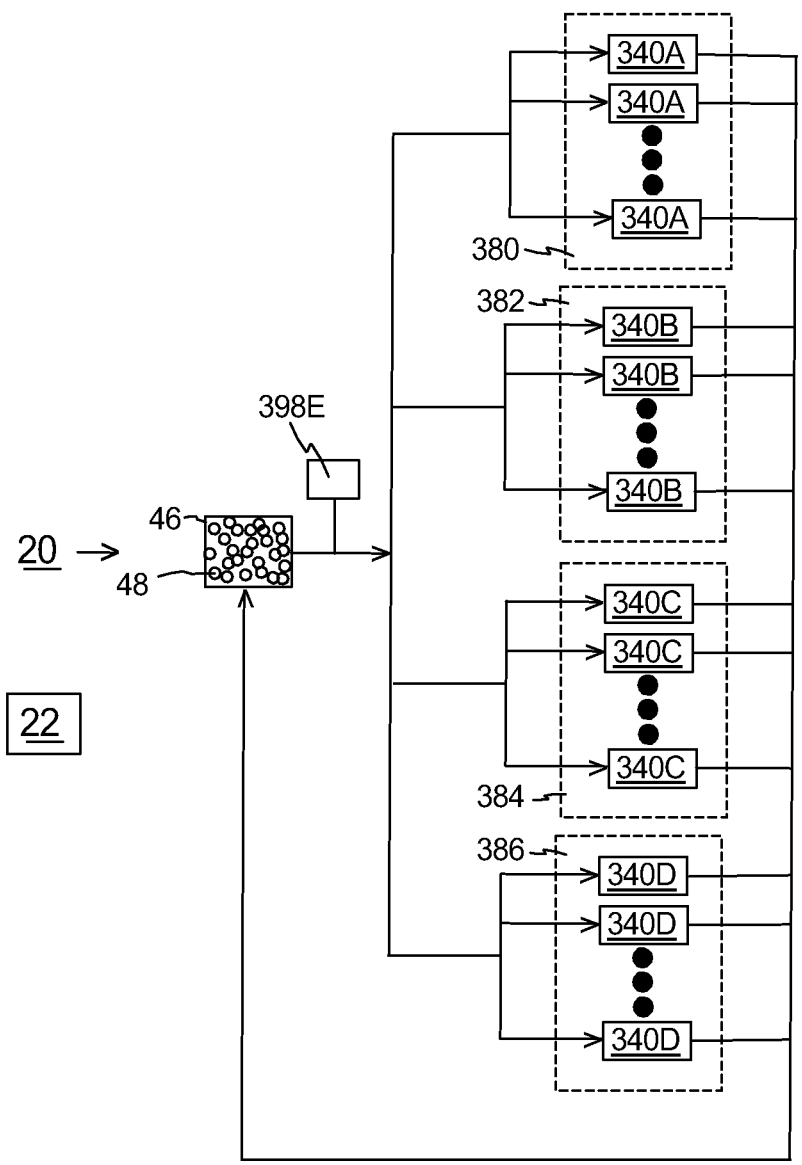
FIG. 3D is another simplified flow chart of a portion of a system having features of the present invention.

FIG. 3D is a simplified schematic of (i) the surface circulation system 46, (ii) the set of first zone conductor units 340A and the first zone 380; (iii) the set of second zone conductor units 340B and the second zone 382, (iv) the set of third zone conductor units 340C and the third zone 384, (v) the set of fourth zone conductor units 340D and the fourth zone 386, and (vi) the control system 22. In this embodiment, the control system 22 can dynamically control a valve 398E to control the flow rate of the surface circulation fluid 48 to the zones 380, 382, 384, 386.

It should be noted that in the embodiment illustrated in FIG. 3D, the surface circulation fluid 48 flows in parallel through the first zone conductor units 340A, the second zone conductor units 340B, the third zone conductor units 340C, and the fourth zone conductor units 340D.

Figure 4:
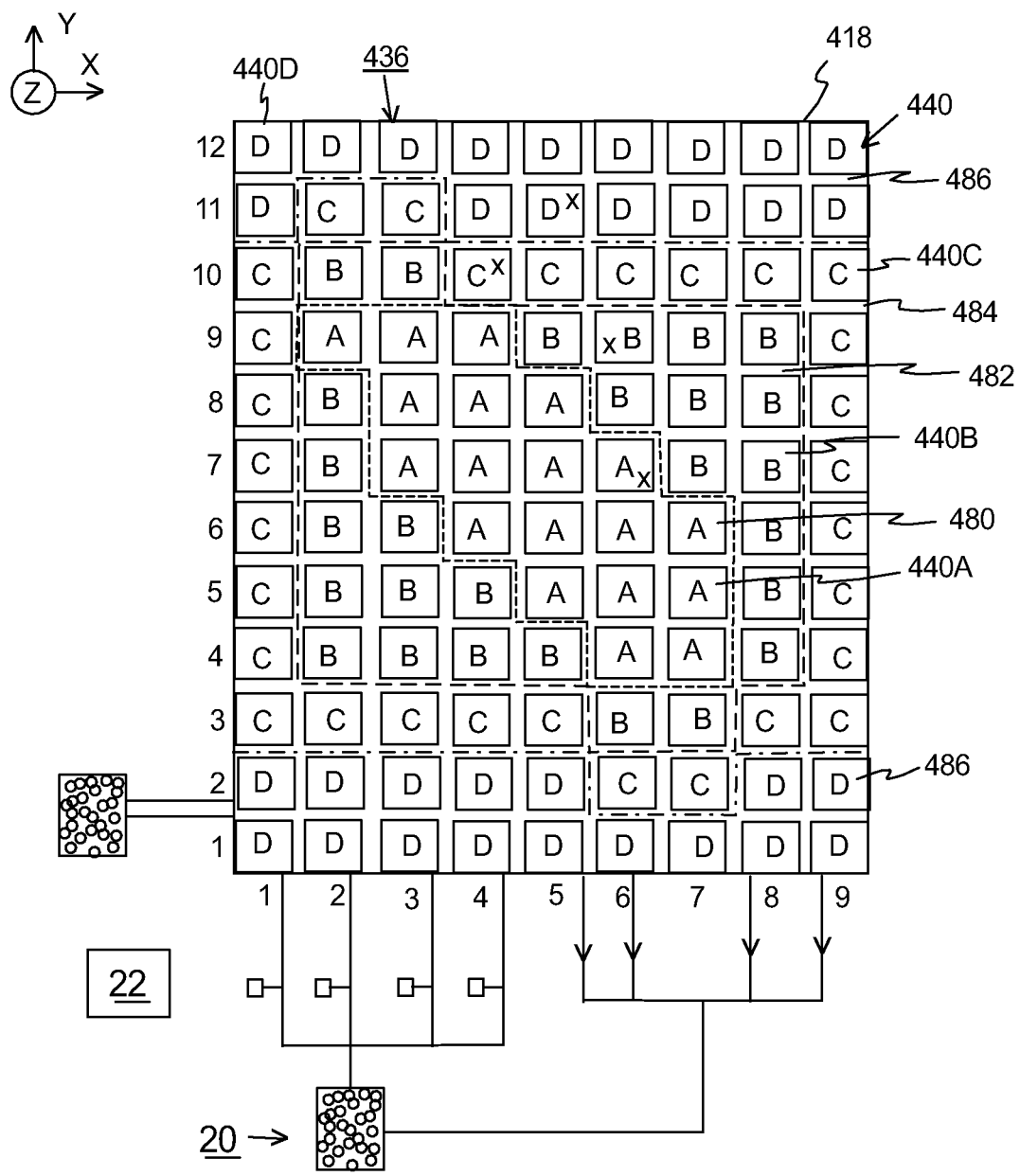
FIG. 4 is a top plan view of another embodiment of a conductor array, a reaction assembly, a schematic of a temperature adjuster, and a control system having features of the present invention.

FIG. 4 is a simplified top view of another embodiment of the conductor array 436 including the plurality of conductor units 440, and the reaction assembly 418, and a schematic of the temperature adjuster 20, and the control system 22 of FIG. 1. In this embodiment, the conductor array 436 is similar to the conductor array 36 described above and illustrated in FIG. 3A. However, in this embodiment, the required movement of the stage (not shown in FIG. 1) is slightly different. Accordingly, the conductor units 440 are grouped differently and cooled differently than the embodiment illustrated in FIG. 3A.

More specifically, in the non-exclusive example illustrated in FIG. 4, the conductor array 436 and the countermass reaction assembly 418 are divided into (i) a centrally located, diagonally shaped first zone 480 (the outer boundary illustrated with a short dashed line); (ii) a second zone 482 (the outer boundary is illustrated with a long dashed line and the inner boundary is illustrated with the short dashed line); (iii) a third zone 484 (the outer boundary is illustrates with a dash-dot line and the inner boundary is illustrated with the long dashed line); and (iv) a pair of fourth zones 486. Further, in this example, (i) the conductor units 440 that are part of the first zone 480 are labeled with an "A" and can be referred to as first zone conductor units 440A; (ii) the conductor units 440 that are part of the second zone 482 are labeled with a "B" and can be referred to as second zone conductor units 440B; (iii) the conductor units 440 that are part of the third zone 484 are labeled with a "C" and can be referred to as third zone conductor units 440C; and (iv) the conductor units 440 that are part of the fourth zones 486 are labeled with a "D" and can be referred to as fourth zone conductor units 440D.

In this example, generally speaking, (i) the first zone conductor units 440A are used the most and require the most cooling; (ii) the second zone conductor units 440B are used the second most and require the second most cooling; (iii) the third zone conductor units 440C are used the third most and require the third most cooling; and (iv) the fourth zone conductor units 440D are used the least and require the least cooling. In this embodiment, the conductor units 40 are grouped based on usage. Stated in another fashion, in the embodiment illustrated in FIG. 4, the conductor array 36 has been divided (i) a set of first zone conductor units 440A that includes nineteen conductor units that require approximately the same amount of cooling; (ii) a set of second zone conductor units 440B that includes twenty-six conductor units that require approximately the same amount of cooling; (iii) a set of third zone conductor units 440C that includes thirty conductor units that require approximately the same amount of cooling; and (iv) two sets of fourth zone conductor units 440D that each includes sixteen conductor units that require approximately the same amount of cooling.

Figure 5:
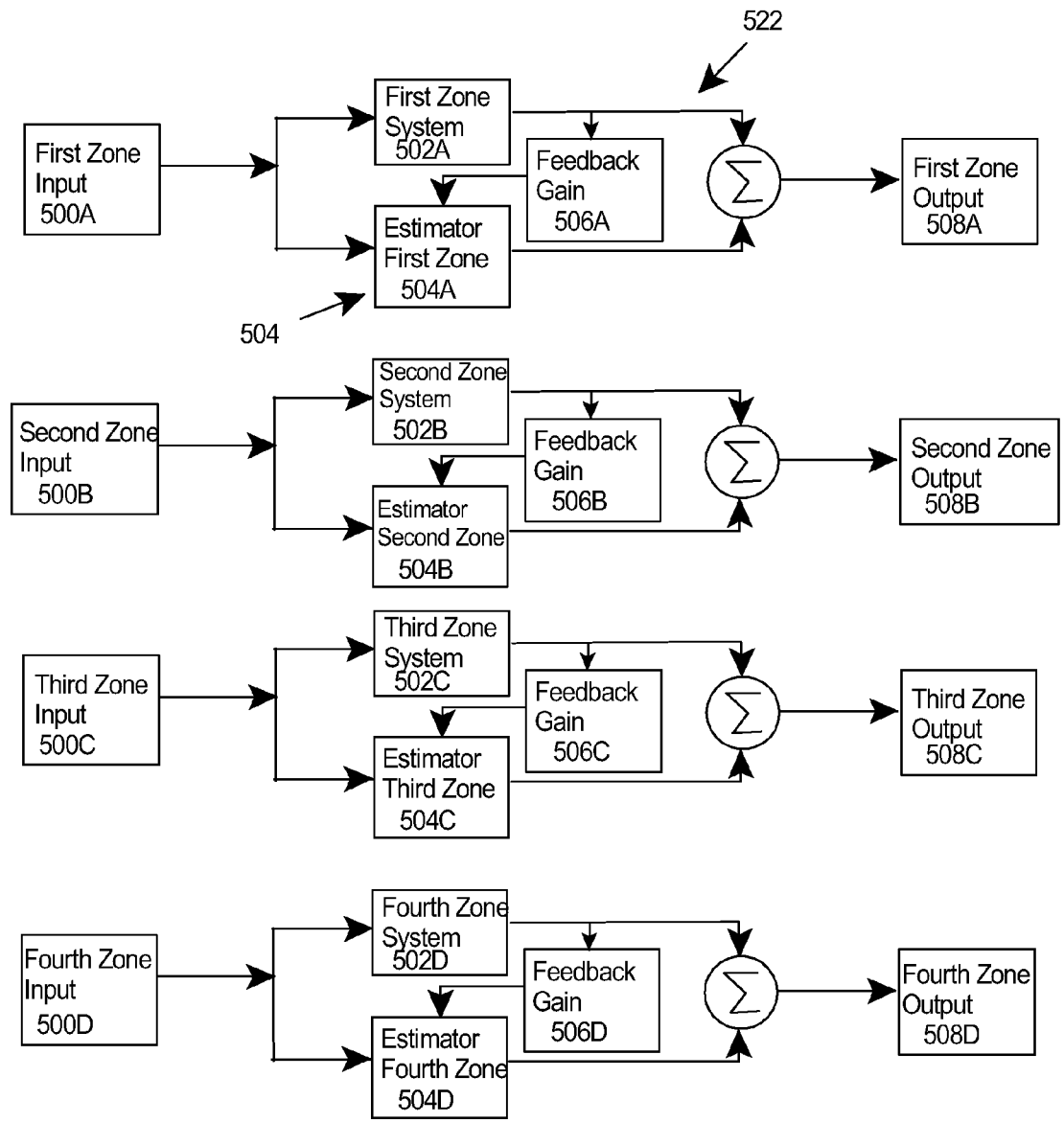
FIG. 5 is a simplified schematic of a control system having features of the present invention.

FIG. 5 is a simplified schematic of one embodiment of the control system 522. In this embodiment, the present invention utilizes a (computer generated) model temperature estimator 504 that is a simulated physical model of the conductor array (not shown in FIG. 5) and/or the countermass reaction assembly 18 (not shown in FIG. 5) that simulates conditions that are substantially similar to the conditions to which the conductor array and/or the countermass reaction assembly itself is subjected. With the present invention, using a mathematical model (model temperature estimator) 504 of the conductor array, (with the projected movements of the stage) the heat distribution (transient and steady state) can be calculated for each zone (not shown in FIG. 5). By evaluating the heat that is transferred from the conductor array to the countermass reaction assembly, the control system 522, via the model temperature estimator can control the temperature controller (not shown in FIG. 5) to accurately control the temperature of the zones.

In the non-exclusive embodiment illustrated in FIG. 5, the control system 522 includes a control loop for each zone. In the first control loop, the first zone input 500A, e.g. the projected usage of the first zone conductor units is fed into the system. Block 502A represents the first zone system and block 504A represents the model temperature estimator for the first zone. With this design, the model temperature estimator 504A estimates the first zone output 508A, e.g. the cooling requirements for the first zone. Further, block 506A represents feedback gain into the estimator 504A to improve the performance of the estimator.

Similarly, in the second control loop, the second zone input 500B, e.g. the projected usage of the second zone conductor units is feed into the system. Block 502B represents the second zone system and block 504B represents the model temperature estimator for the second zone. With this design, the model temperature estimator 504B estimates the second zone output 508B, e.g. the cooling requirements for the second zone. Further, block 506B represents feedback gain into the estimator 504B to improve the performance of the estimator.

Further, in the third control loop, the third zone input 500C, e.g. the projected usage of the third zone conductor units is feed into the system. Block 502C represents the third zone system and block 504C represents the model temperature estimator for the third zone. With this design, the model temperature estimator 504C estimates the third zone output 508C, e.g. the cooling requirements for the third zone.

Further, block 506C represents feedback gain into the estimator 504C to improve the performance of the estimator.

Finally, in the fourth control loop, the fourth zone input 500D, e.g. the projected usage of the fourth zone conductor units is fed into the system. Block 502D represents the fourth zone system and block 504D represents the model temperature estimator for the fourth zone. With this design, the model temperature estimator 504D estimates the fourth zone output 508D, e.g. the cooling requirements for the fourth zone. Further, block 506D represents feedback gain into the estimator 504D to improve the performance of the estimator.

With the present invention, utilizing the simulated physical model (mathematical model; model temperature estimator) 504, the control system 522 predicts the required coolant flow for each zones, and controls the temperature controller to selectively and individually control the flow of the circulation fluid to each of the zones to achieve the predicted cooling requirements. For example, the model temperature estimator 504 can estimate a temperature of each of the zones based on the projected usage of the conductor units. With this design, the temperature adjuster can be controlled to accurately control the temperature of the zones.

Further, with the feedback from the conductor array and/or the countermass reaction assembly (e.g. with the feedback elements), the model temperature estimator 504 can be regularly updated and improved so as to more accurately and effectively predict the required coolant flow rate for each zone, and control the temperature of the conductor array and/or the countermass reaction assembly. As a result thereof, in certain embodiments, using a limited number of temperature sensors in conjunction with a system thermal model, the flow rate to various zones can be controlled. In certain embodiments, the purpose of the sensors is to update the thermal model, which in turn is used to determine the flow rates for a coil unit or groups of coil unit.

Alternatively, the control system can use the feedback elements to directly determine the required flow rates to each of the zones.

FIG. 6 is a schematic view illustrating an exposure apparatus 630 useful with the present invention. The exposure apparatus 630 includes the apparatus frame 680, an illumination system 682 (irradiation apparatus), a reticle stage assembly 684, an optical assembly 686 (lens assembly), and a wafer stage assembly 610. The stage assemblies provided herein can be used as the wafer stage assembly 610. Alternately, with the disclosure provided herein, the stage assemblies provided herein can be modified for use as the reticle stage assembly 684.

The exposure apparatus 630 is particularly useful as a lithographic device that transfers a pattern (not shown) of an integrated circuit from the reticle 688 onto the semiconductor wafer 690. The exposure apparatus 630 mounts to the mounting base 624, e.g., the ground, a base, or floor or some other supporting structure.

The apparatus frame 680 is rigid and supports the components of the exposure apparatus 630. The design of the apparatus frame 680 can be varied to suit the design requirements for the rest of the exposure apparatus 630.

The illumination system 682 includes an illumination source 692 and an illumination optical assembly 694. The illumination source 692 emits a beam (irradiation) of light energy. The illumination optical assembly 694 guides the beam of light energy from the illumination source 692 to the optical assembly 686. The beam illuminates selectively different portions of the reticle 688 and exposes the semiconductor wafer 690. In FIG. 6, the illumination source 692 is illustrated as being supported above the reticle stage assembly 684. Alternatively, the illumination source 692 can be secured to one of the sides of the apparatus frame 680 and the energy beam from the illumination source 692 is directed to above the reticle stage assembly 684 with the illumination optical assembly 694.

The optical assembly 686 projects and/or focuses the light passing through the reticle to the wafer. Depending upon the design of the exposure apparatus 630, the optical assembly 686 can magnify or reduce the image illuminated on the reticle.

The reticle stage assembly 684 holds and positions the reticle 688 relative to the optical assembly 686 and the wafer 690. Similarly, the wafer stage assembly 610 holds and positions the wafer 690 with respect to the projected image of the illuminated portions of the reticle 688.

There are a number of different types of lithographic devices. For example, the exposure apparatus 630 can be used as scanning type photolithography system that exposes the pattern from the reticle 688 onto the wafer 690 with the reticle 688 and the wafer 690 moving synchronously. Alternatively, the exposure apparatus 630 can be a step-and-repeat type photolithography system that exposes the reticle 688 while the reticle 688 and the wafer 690 are stationary.

However, the use of the exposure apparatus 630 and the stage assemblies provided herein are not limited to a photolithography system for semiconductor manufacturing. The exposure apparatus 630, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, machine tools, metal cutting machines, inspection machines and disk drives.

Figure 7:
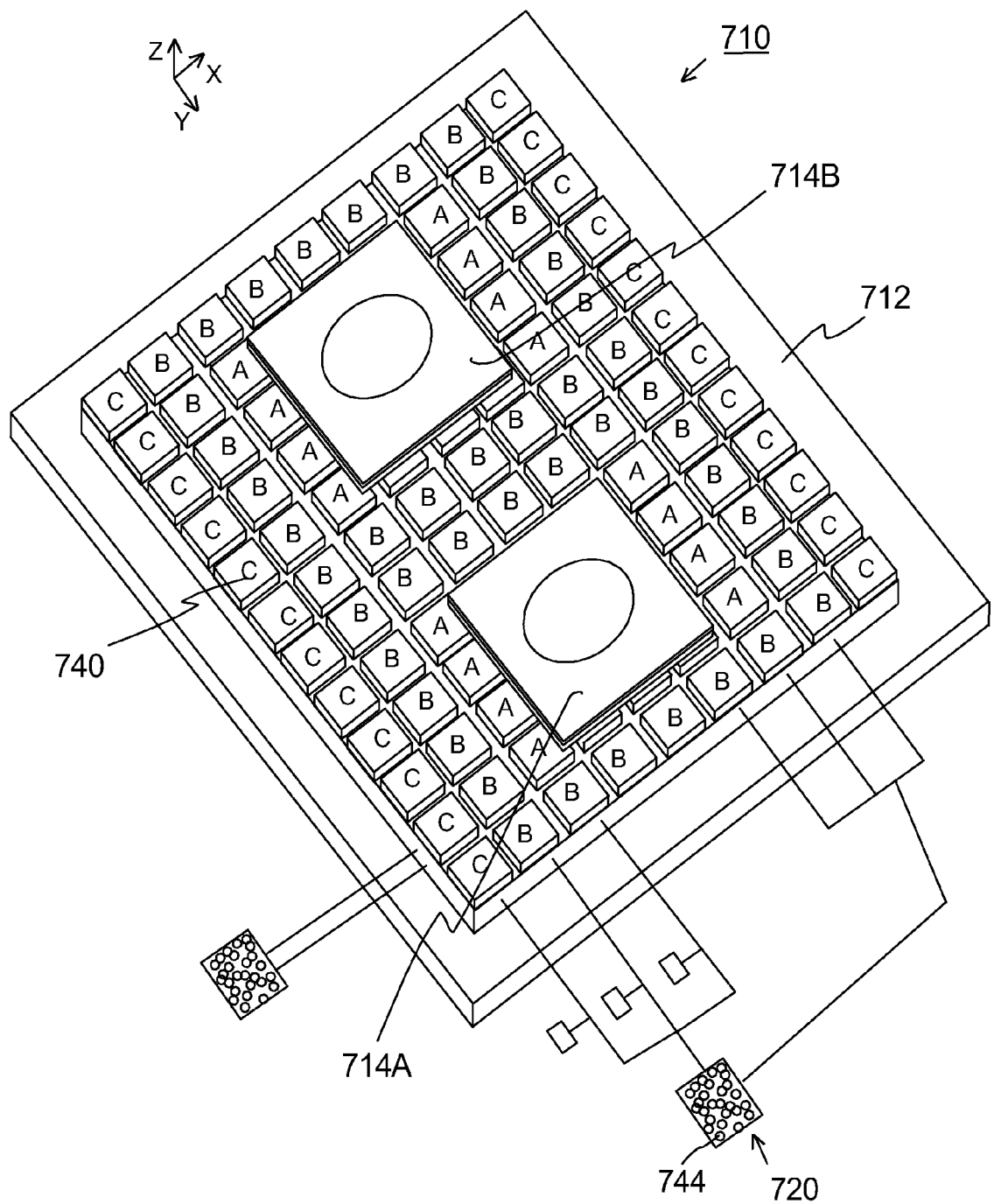
FIG. 7 is a perspective view of another embodiment of a stage assembly having features of the present invention.

In the embodiments previously described herein and illustrated in FIG. 1, the stage assembly 10 includes a single stage 14 that is moved relative to the stage base 12. Alternately, for example, as illustrated in FIG. 7, the stage assembly 710 can be designed to include multiple stages 714A, 714B (only two are illustrated in FIG. 7) that can be independently moved and positioned relative to the stage base 712. As a non-exclusive example, the multiple stages 714A, 714B can be used in a photolithography system including an exposure region and a measurement region. In this case, each region can be divided into a plurality of different zones similar to the embodiments described above, based on the cooling requirements of the respective conductor units 740. Such multiple stages are described in U.S. Pat. No. 6,208,407 and U.S. Pat. No. 6,590,634. As far as permitted, the contents of U.S. Pat. Nos. 6,208,407 and 6,590,634 are incorporated herein by reference. Further, in FIG. 7, (i) the conductor units 740 are labeled with "A", "B", and "C" similar to the coil units 40 shown in FIG. 3A. (The conductor units 740 positioned underneath each stage 714A, 714B are labeled with "A").

In this embodiment, the temperature adjuster 720 can independently control the flow rate of the circulation fluid 744 to different zones. With this design, more circulation fluid 744 can be directed to conductor units 740 that are used the most and that are generating the most heat. This will allow for the efficient cooling.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 8:
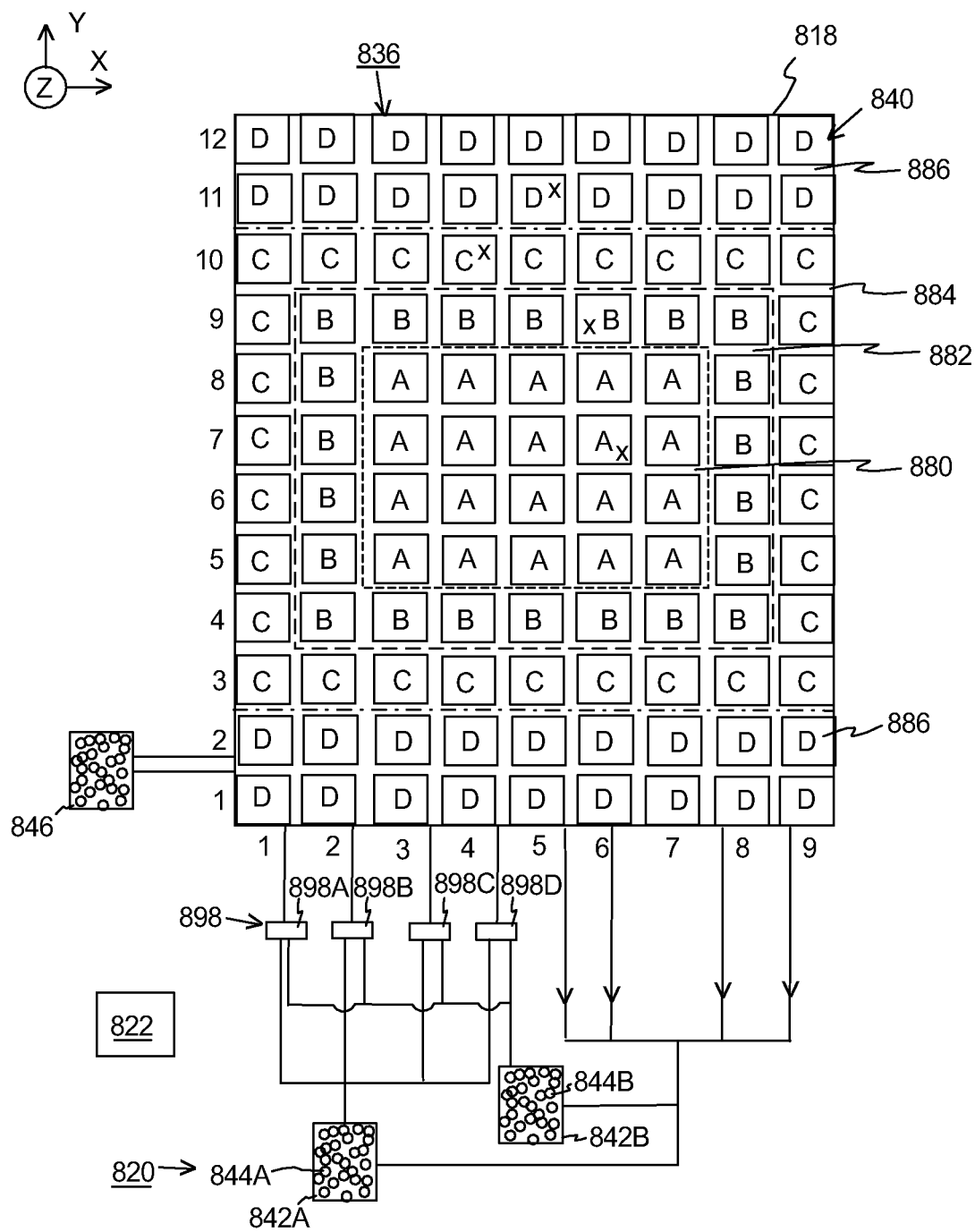
FIG. 8 is a top plan view of another embodiment of a conductor array, a reaction assembly, a schematic of a temperature adjuster, and a control system having features of the present invention.

FIG. 8 is a simplified top view of the conductor array 836 including the plurality of conductor units 840, and the reaction assembly 818, and the control system 822 that are similar to the corresponding components described above. However, in this embodiment, the temperature adjuster 820 is slightly different. More specifically, in this embodiment, the temperature adjuster 820 is designed to independently adjust and control both the temperature and the flow rate of the body circulation fluid that is directed to each of the zones, e.g. the first zone 880, the second zone 882, the third zone 884, and the fourth zone 886. Alternatively, the temperature adjuster 820 can be designed to control the temperature of the circulation fluid without adjusting the rate to each zone.

In the Embodiment illustrated in FIG. 8, the temperature adjuster 820 includes multiple body circulation systems in addition to the surface circulation system 846. For example, the temperature adjuster 820 can include a first body circulation system 842A that delivers a first body circulation fluid 844A at a first outlet temperature, and a second body circulation system 842B that delivers a second body circulation fluid 844B at a second outlet temperature that is different from the first outlet temperature (e.g one hot and one cold) to the valve assembly 898. In this embodiment, the control system 822 can independently control the valves 898A, 898B, 898C, 898D within valve assembly 898 to direct varying amounts of each body circulation fluid 844A, 844B from each supplied temperature to independently control the temperature of the body circulation fluid supplied to each of the zones 880, 882, 884, 886.

With this design, the temperature adjuster 820 can direct the body circulation fluid (i) at a first flow rate and at a first temperature through the zone 880; (ii) at a second flow rate and at a second temperature through the second zone 882; (iii) at a third flow rate and at a third temperature through the third zone 884; and (iv) at a fourth flow rate and at a fourth temperature through the fourth zone 886. It should be noted that the flow rates can be the same or different for each zone 880, 882, 884, 886, and/or the temperatures can be the same or different for each of the zone 880, 882, 884, 886.

Figure 9:
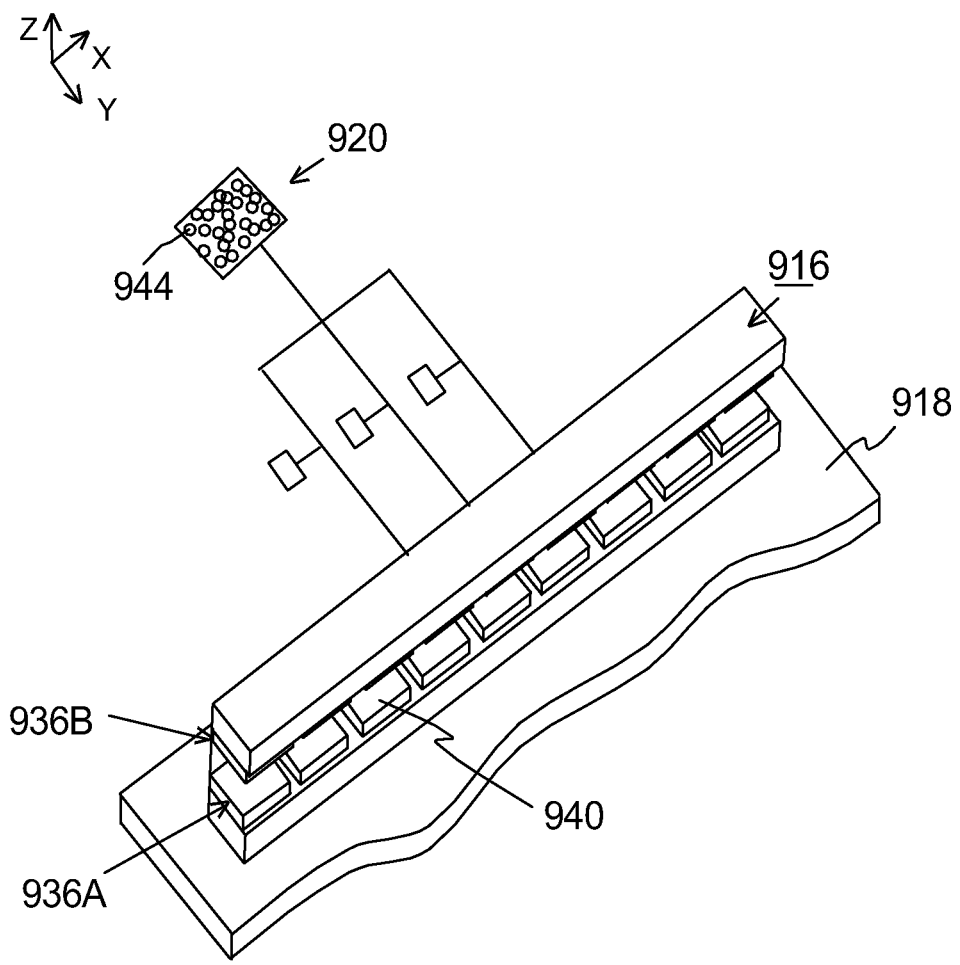
FIG. 9 is a perspective view of a portion of another embodiment of a stage assembly having features of the present invention.

FIG. 9 is a perspective view of a portion of another embodiment of a stage mover 916, a reaction assembly 918, and a temperature adjuster 920. In this embodiment the stage mover 916 is a linear motor that includes (i) a moving magnet array (not shown in FIG. 9) that is attached to the stage (not shown in FIG. 9); and (ii) a pair of spaced apart conductor arrays 936A, 936B that are secured to the reaction assembly 918. In this embodiment, each conductor arrays 936A, 936B includes a plurality of conductor units 940. Further the conductor units 940 can be divided into a number of different sets or zone depending upon the projected usage. In this embodiment, the temperature adjuster 920 can independently adjust the temperature and/or flow rate of the circulation fluid 944 to each of the zones similar to the method described above.

Figure 10A:
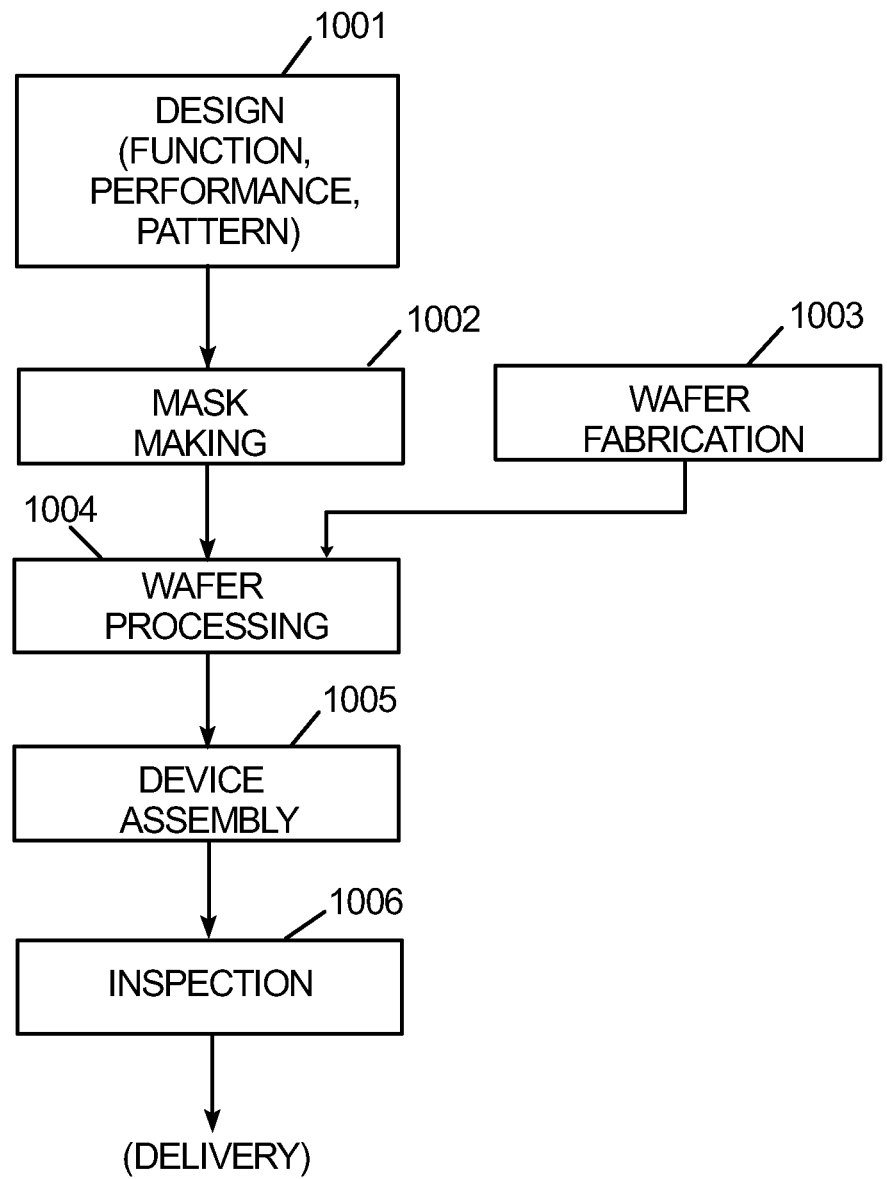
FIG. 10A is a flow chart that outlines a process for manufacturing a device in accordance with the present invention.

Semiconductor devices can be fabricated using the above described systems, by the process shown generally in FIG. 10A. In step 1001 the device's function and performance characteristics are designed. Next, in step 1002, a mask (reticle) having a pattern is designed according to the previous designing step, and in a parallel step 1003 a wafer is made from a silicon material. The mask pattern designed in step 1002 is exposed onto the wafer from step 1003 in step 1004 by a photolithography system described hereinabove in accordance with the present invention. In step 1005 the semiconductor device is assembled (including the dicing process, bonding process and packaging process), finally, the device is then inspected in step 1006.

Figure 10B:
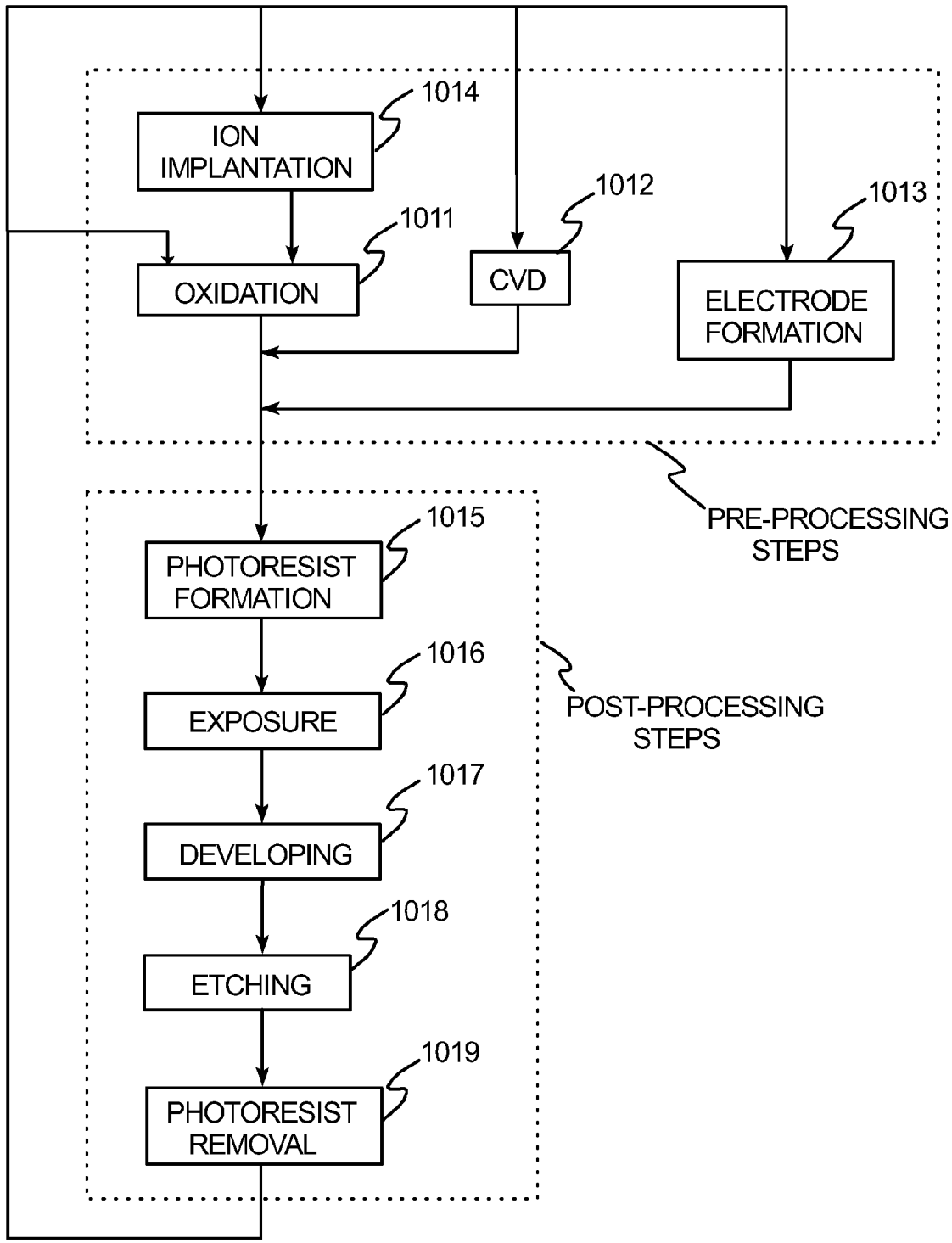
FIG. 10B is a flow chart that outlines device processing in more detail.

FIG. 10B illustrates a detailed flowchart example of the above-mentioned step 1004 in the case of fabricating semiconductor devices. In FIG. 10B in step 1011 (oxidation step), the wafer surface is oxidized. In step 1012 (CVD step), an insulation film is formed on the wafer surface. In step 1013 (electrode formation step), electrodes are formed on the wafer by vapor deposition. In step 1014 (ion implantation step), ions are implanted in the wafer. The above mentioned steps 1011-1014 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 1015 (photoresist formation step), photoresist is applied to a wafer. Next, in step 1016 (exposure step), the above-mentioned exposure device is used to transfer the circuit pattern of a mask (reticle) to a wafer. Then in step 1017 (developing step), the exposed wafer is developed, and in step 1018 (etching step), parts other than residual photoresist (exposed material surface) are removed by etching. In step 1019 (photoresist removal step), unnecessary photoresist remaining after etching is removed.

Multiple circuit patterns are formed by repetition of these preprocessing and post-processing steps.

While the particular stage assembly as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly that moves a device, the stage assembly comprising:
   a stage that retains the device;
   an assembly;
   a stage mover that moves the stage relative to the assembly, the stage mover including a magnet array that is coupled to one of the stage and the assembly, and a conductor array that is coupled to the other of the stage and the assembly, the conductor array including a set of first zone conductor units that are part of a first zone, and a set of second zone conductor units that are part of a second zone, the first zone and the second zone being based on projected heat generated within the first zone conductor units and the second zone conductor units for a projected usage of the stage, wherein current directed to the conductor array generates at least one force that can move one of the magnet array and the conductor array relative to the other array along a first axis;

a model temperature estimator that is a simulated physical model of the conductor array, the model temperature estimator (i) estimating a first estimated temperature of the set of first zone conductor units based on a projected usage of the first zone conductor units, and (ii) estimating a second estimated temperature of the set of second zone conductor units based on a projected usage of the second zone conductor units; and a temperature adjuster that adjusts a first temperature of the set of first zone conductor units based on the first estimated temperature, and that adjusts a second temperature of the set of second zone conductor units based on the second estimated temperature.

2. The stage assembly of claim 1 further comprising a stage base, wherein the assembly is a countermass reaction assembly that is supported by the stage base and that moves relative to the stage base along the first axis, wherein current directed to the conductor array generates the at least one force that can move one of the magnet array and the conductor array, and the stage, along the first axis in a first direction, and can move the other of the magnet array and the conductor array, and the countermass reaction assembly, along the first axis in a second direction that is opposite the first direction.

3. The stage assembly of claim 2 wherein the stage mover is a planar motor.

4. The stage assembly of claim 2 wherein the stage mover is a linear motor.

5. The stage assembly of claim 1 wherein the temperature adjuster directs a first flow of a circulation fluid into the set of first zone conductor units at a first flow rate, and directs a second flow of the circulation fluid into the set of second zone conductor units at a second flow rate that is different than the first flow rate; and wherein the stage assembly further comprises a control system that selectively controls the first flow rate to heat and/or cool the first zone conductor units to a desired first temperature, and selectively controls the second flow rate to heat and/or cool the second zone conductor units to a desired second temperature.

6. The stage assembly of claim 5 wherein the first flow is provided at the first flow rate and the second flow is provided at the second flow rate; and wherein the control system selectively adjusts the first flow rate to heat and/or cool the first zone conductor units to the desired first temperature, and selectively adjusts the second flow rate to heat and/or cool the second zone conductor units to the desired second temperature which may be the same as the desired first temperature.

7. The stage assembly of claim 5 wherein the control system selectively controls the temperature of the first flow to heat and/or cool the first zone conductor units to the desired first temperature, and selectively controls the temperature of the second flow to heat and/or cool the second zone conductor units to the desired second temperature which may be the same as the desired first temperature.

8. The stage assembly of claim 5 wherein the conductor array includes a set of third zone conductor units that are part of a third zone, and wherein, the temperature adjuster directs the circulation fluid into the set of third zone conductor units at a third flow rate that may be different from either the first flow rate and/or the second flow rate; and wherein the control system selectively controls the third flow rate to heat and/or cool the set of third zone conductor units to a desired third temperature, which may be the same as either the desired first temperature and/or the desired second temperature.

9. The stage assembly of claim 5 wherein the conductor array includes a set of third zone conductor units that are part of a third zone, and wherein, the temperature adjuster directs a third flow of the circulation fluid into the set of third zone conductor units; and wherein the control system selectively controls the temperature of the third flow to heat and/or cool the set of third zone conductor units to a desired third temperature, which may be the same as either the desired first temperature and/or the desired second temperature.

10. The stage assembly of claim 5 wherein the control system adjusts the first flow rate based on the first estimated temperature of the set of first zone conductor units, and adjusts the second flow rate based on the second estimated temperature of the set of second zone conductor units.

11. The stage assembly of claim 5 wherein the circulation fluid is directed to each of the first zone conductor units substantially in parallel, and wherein the circulation fluid is directed to each of the second zone conductor units substantially in parallel.

12. The stage assembly of claim 5 wherein each of the conductor units includes a surface housing that is adjacent to the magnet array, and wherein the temperature adjuster directs a surface circulation fluid through the surface housing of each of the conductor units to maintain the temperature of the surface housings at a predetermined surface temperature.

13. The stage assembly of claim 5 wherein each conductor unit includes a first coil set, a second coil set and a body housing positioned near the coil sets, and wherein the circulation fluid is directed through the body housing of each of the conductor units.

14. The stage assembly of claim 5 further comprising a feedback assembly that provides feedback regarding the temperature of at least one of (i) a portion of the first zone conductor units, (ii) a portion of the second zone conductor units, and (iii) a portion of the circulation fluid; the feedback being used by the control system to determine proper settings of the temperature adjuster.

15. The stage assembly of claim 14 wherein the control system uses the feedback to adjust at least one of the first flow rate and the second flow rate.

16. The stage assembly of claim 14 wherein the control system uses the feedback to adjust at least one of (i) the temperature of the first flow, and (ii) the temperature of the second flow.

17. The stage assembly of claim 1 further comprising a feedback assembly that provides feedback regarding the temperature of at least a portion of the first zone conductor units and at least a portion of the second zone conductor units, the feedback being fed into the model temperature estimator to improve the model temperature estimator.

18. An exposure apparatus comprising an illumination system and the stage assembly of claim 1.

19. The stage assembly of claim 1 wherein the temperature adjuster adjusts the temperature of the set of first zone conductor units and the set of second zone conductor units independently.

20. A stage assembly that moves a device along a first axis, the stage assembly comprising:
a stage that retains the device;
a stage base;
a countermass reaction assembly that is supported by the stage base and that moves relative to the stage base along the first axis;
a planar, stage mover that moves the stage, the stage mover including a magnet array that is coupled to one of the stage and the countermass reaction assembly, and a conductor array that is coupled to the other of the stage and the countermass reaction assembly, the conductor array including a set of first zone conductor units that are part of a first zone, and a set of second zone conductor units that are part of a second zone, the first zone and the second zone being based on projected heat generated within the first zone conductor units and the second zone conductor units for a projected usage of the stage, wherein current directed to the conductor array generates a force that can move one of the magnet array and the conductor array, and the stage, along the first axis in a first direction, and can move the other of the magnet array and the conductor array, and the countermass reaction assembly, along the first axis in a second direction that is opposite the first direction; wherein each conductor unit includes a first coil set, a second coil set, a body housing positioned near the coil sets;
a model temperature estimator that is a simulated physical model of the conductor array, the model temperature estimator (i) estimating a first estimated temperature of the set of first zone conductor units based on a projected usage of the first zone conductor units, and (ii) estimating a second estimated temperature of the set of second zone conductor units based on a projected usage of the second zone conductor units; and
a temperature adjuster that adjusts a first zone temperature of the set of first zone conductor units to a desired first temperature based on the first estimated temperature by directing a body circulation fluid into the body housing of each of the first zone conductor units at a first flow rate and a first temperature, and that adjusts a second zone temperature of the set of second zone conductor units to a desired second temperature based on the second estimated temperature by directing the body circulation fluid into the body housing of each of the second zone conductor units at a second flow rate and a second temperature.

21. The stage assembly of claim 20 wherein the conductor array includes a set of third zone conductor units that are part of a third zone, and wherein, the temperature adjuster adjusts a third zone temperature of the set of third zone conductor units to a desired third temperature by directing the body circulation fluid into the set of third zone conductor units at a third flow rate and a third temperature.

22. The stage assembly of claim 20 further comprising a control system that adjusts at least one of the first flow rate and the first temperature based on the first estimated temperature of the set of first zone conductor units, and adjusts at least one of the second flow rate and the second temperature based on the second estimated temperature of the set of second zone conductor units.

23. The stage assembly of claim 20 further comprising a feedback assembly that provides feedback regarding the temperature of at least one of (i) a portion of the first zone conductor units, (ii) a portion of the second zone conductor units, and (iii) a portion of the circulation fluid, the feedback being fed into the model temperature estimator to improve the model temperature estimator.

24. The stage assembly of claim 20 wherein the body circulation fluid is directed to each of the first zone conductor units substantially in parallel, and wherein the body circulation fluid is directed to each of the second zone conductor units substantially in parallel.

25. An exposure apparatus comprising an illumination system and the stage assembly of claim 20.

26. A method for moving a device, the method comprising the steps of:
retaining the device with a stage;
positioning a reaction assembly near the stage;
moving the stage with a stage mover that includes a magnet array that is coupled to one of the stage and the reaction assembly, and a conductor array that is coupled to the other of the stage and the reaction assembly, the conductor array including a set of first zone conductor units that are part of a first zone, and a set of second zone conductor units that are part of a second zone, the first zone and the second zone being based on projected heat generated within the first zone conductor units and the second zone conductor units for a projected usage of the stage, wherein current directed to the conductor array generates a force that can move one of the magnet array and the conductor array relative to the other array along a first axis;
estimating a first estimated temperature of the set of first zone conductor units based on a projected usage of the first zone conductor units with a model temperature estimator that is a simulated physical model of the conductor array;
estimating a second estimated temperature of the set of second zone conductor units based on a projected usage of the second zone conductor units with the model temperature estimator;
adjusting a first temperature of the set of first zone conductor units with a temperature adjuster based on the first estimated temperature; and
adjusting a second temperature of the set of second zone conductor units with the temperature adjuster based on the second estimated temperature.

27. The method of claim 26 wherein the step of adjusting the first temperature includes the step of directing a first flow of a circulation fluid into the set of first zone conductor units at a first flow rate and a first flow temperature, and wherein the step of adjusting the second temperature includes the step of directing a second flow of the circulation fluid into the set of second zone conductor units at a second flow rate and a second flow temperature.

28. The method of claim 27 wherein the step of adjusting the first temperature includes the step of controlling the temperature adjuster with a control system to adjust the first flow rate based on the first estimated temperature of the set of first zone conductor units, and wherein the step of adjusting the second temperature includes the step of controlling the temperature adjuster with the control system to adjust the second flow rate based on the second estimated temperature of the set of second zone conductor units.

29. The method of claim 27 wherein the step of adjusting the first temperature includes the step of controlling the temperature adjuster with a control system to adjust the first flow temperature based on the first estimated temperature of the set of first zone conductor units, and wherein the step of adjusting the second temperature includes the step of controlling the temperature adjuster with the control system to adjust the second flow temperature based on the second estimated temperature of the set of second zone conductor units.

30. The method of claim 26 wherein each of the conductor units includes a surface housing that is adjacent to the magnet array, and wherein the method further includes the step of directing a surface circulation fluid through the surface housing of each of the conductor units to maintain the temperature of the surface housings at a predetermined surface temperature.

31. The stage assembly of claim 1 further comprising a control system that controls the set of first zone conductor units, and controls the set of second zone conductor units independently from the set of first zone conductor units.

32. The stage assembly of claim 20 wherein each of the conductor units includes a surface housing that is adjacent to the magnet array, and wherein the temperature adjuster directs a surface circulation fluid through the surface housing of each of the conductor units to maintain the temperature of the surface housings at a predetermined surface temperature.

\* \* \* \* \*